(12) United States Patent
Lee et al.

(10) Patent No.: US 7,642,554 B2
(45) Date of Patent: Jan. 5, 2010

(54) ARRAY SUBSTRATE FOR LIQUID CRYSTAL DISPLAY DEVICE

(75) Inventors: Seok-Woo Lee, Anyang-si (KR); Yong-In Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/314,443

(22) Filed: Dec. 10, 2008

(65) Prior Publication Data

US 2009/0134398 A1    May 28, 2009

Related U.S. Application Data

(62) Division of application No. 11/453,910, filed on Jun. 16, 2006, now Pat. No. 7,473,926.

(30) Foreign Application Priority Data

Nov. 9, 2005  (KR) .................. 10-2005-0106837

(51) Int. Cl.
*H01L 29/786* (2006.01)
*H01L 31/036* (2006.01)
*G02F 1/1343* (2006.01)
*G02F 1/136* (2006.01)
*G09G 3/36* (2006.01)

(52) U.S. Cl. .................. 257/59; 257/57; 257/72; 349/38; 349/39; 349/43; 349/114; 345/92

(58) Field of Classification Search ............. 257/57, 257/59, 72; 349/43, 38, 39, 114; 345/92
See application file for complete search history.

(56) References Cited

U.S. PATENT DOCUMENTS

| | | | |
|---|---|---|---|
| 6,569,717 B1 * | 5/2003 | Murade | 438/149 |
| 6,657,688 B2 * | 12/2003 | Nagata et al. | 349/113 |
| 2006/0008932 A1 * | 1/2006 | Oh et al. | 438/34 |

* cited by examiner

*Primary Examiner*—Long K Tran
(74) *Attorney, Agent, or Firm*—McKenna Long & Aldridge

(57) ABSTRACT

An array substrate for an LCD device and a method of fabricating the same are disclosed. The array substrate includes: a substrate defining a display area and a non-display area; an n-type driving TFT and a p-type driving TFT in the non-display area; a switching TFT in the display region; a storage capacitor in the display region, the storage capacitor including first to third storage layers sequentially layered with intervening insulating layers, wherein the first storage layer contacts a first semiconductor layer under the first storage layer; and a pixel electrode in the display region, the pixel electrode connected to the switching TFT.

4 Claims, 48 Drawing Sheets

ARRAY SUBSTRATE FOR LIQUID CRYSTAL DISPLAY DEVICE

This application is a Divisional of application Ser. No. 11/453,910, filed Jun. 16, 2006, now U.S. Pat. No. 7,473,926 now allowed; which claims priority to Korean Patent Application No. 10-2005-0106837, filed Nov. 9, 2005 all of which are hereby incorporated by reference as if fully set forth herein.

BACKGROUND OF THE INVENTION

1. Field of the Invention

The present invention relates to a liquid crystal display (LCD) device, and more particularly, to an array substrate for an LCD device and a method of fabricating the same.

2. Discussion of the Related Art

Flat panel display (FPD) devices having high portability and low power consumption have been the subject of recent research and development. Liquid crystal display (LCD) devices are a type of FPD devices and are commonly used as monitors for notebook and desktop computers because of their ability to display high-resolution images, wide ranges of different colors, and moving images.

In most cases, an LCD device includes a color filter substrate and an array substrate separated from each other and having a liquid crystal layer interposed therebetween. The color filter substrate includes a common electrode and the array substrate includes a pixel electrode. When a voltage is supplied to the common electrode and the pixel electrode, an electric field is generated and changes the orientation of liquid crystal molecules of the liquid crystal layer due to optical anisotropy within the liquid crystal layer. Consequently, light transmittance characteristics of the liquid crystal layer are modulated and images are displayed by the LCD device.

Active matrix type LCD devices are commonly used because of their superiority in displaying moving images. Active matrix-type LCD devices include pixel regions disposed in a matrix. A thin film transistor (TFT) is formed in each pixel region and is a switching element. While forming the TFT, hydrogenated amorphous silicon (a-Si:H) is deposited over a large area of a substrate. Hydrogenated amorphous silicon yields higher productivity and is easily fabricated on the large area of the substrate. In addition, because the hydrogenated amorphous silicon (a-Si:H) is deposited at a relatively low temperature, an inexpensive glass substrate may be used. Accordingly, the hydrogenated amorphous silicon is commonly used in the TFT, and the TFT is referred to as an amorphous silicon thin film transistor (a-Si TFT).

However, because the atomic arrangement of the hydrogenated amorphous silicon is disordered, weak silicon-silicon (Si—Si) bonds and dangling bonds exist in the hydrogenated amorphous silicon. These types of bonds become metastable when light or an electric field is applied to the hydrogenated amorphous silicon. As a result, this metastability makes the TFT unstable. Electrical characteristics of hydrogenated amorphous silicon are especially degraded due to light irradiation. Furthermore, it is difficult to implement a TFT using hydrogenated amorphous silicon in a driving circuit because electric characteristics are degraded. These degraded electric characteristics include a relatively low field effect mobility and poor reliability.

To solve these problems, a polycrystalline silicon thin film transistor (p-Si TFT) may be employed. Due to a higher field effect mobility of a p-Si TFT compared to an a-Si TFT, a driving circuit and a switching element may be fabricated simultaneously. Accordingly, production costs are reduced and a driving circuit is simply fabricated on a substrate where a switching element is formed.

FIG. 1 is a schematic view showing an LCD device according to the related art where a switching element and a driving circuit are formed on a single substrate. In FIG. 1, a display area "D1" and a non-display area "D2" in a periphery of the display area "D1" are defined on a single substrate 10. The display area "D1" is disposed at a central portion of the substrate 10, while the non-display area "D2" is disposed at left and top portions of the display area "D1." The non-display area "D2" includes a gate driving circuit 16 and a data driving circuit 18. The display area "D1" includes a plurality of gate lines 12 connected to the gate driving circuit 16 and a plurality of data lines 14 connected to the data driving circuit 18. The gate line 12 and the data line 14 cross each other to define a pixel region "P." A pixel electrode 17 is formed in the pixel region "P." A thin film transistor (TFT) "Ts" formed as a switching element is connected to the pixel electrode 17. The gate driving circuit 16 supplies a scan signal to the TFT "Ts" through the gate line 12 and the data driving circuit 18 supplies a data signal to the pixel electrode 17 through the data line 14.

The gate driving circuit 16 and the data driving circuit 18 are connected to an input terminal (not shown) to receive external signals. Accordingly, the gate driving circuit 16 and the data driving circuit 18 process the externals signals from the input terminal to generate the scan signal and the data signal. To generate the scan signal and the data signal, the gate driving circuit 16 and the data driving circuit 18 include a plurality of TFTs forming complementary metal-oxide-semiconductor (CMOS) elements. For example, an inverter including negative (n)-type and positive (p)-type TFTs may be formed in the gate driving circuit 16 and the data driving circuit 18.

FIG. 2 is a schematic plan view showing a display area of an array substrate for an LCD device according to the related art.

In FIG. 2, a gate line "GL" and a data line "DL" cross each other to define a pixel region "P" on a substrate 30. A thin film transistor "Ts" is connected to the gate line "GL" and the data line "DL." A storage line "SL" is also shown. A pixel electrode 82 is connected to the thin film transistor "Ts." For example, the thin film transistor "Ts" includes a gate electrode 52, a semiconductor layer 38, a source electrode 74a and a drain electrode 74b. The semiconductor layer 38 may include polysilicon material.

Further, a storage capacitor "Cst" including first, second and third storage electrodes 40, 54 and 76 and an intervening insulating layer (not shown) is formed in a portion of the pixel region "P."

FIGS. 3A and 3B are schematic cross-sectional views showing an array substrate for an LCD device according to the related art where a switching element and a driving circuit are formed on a single substrate. FIG. 3B is a cross-sectional view taken along line "III-III" of FIG. 2.

In FIGS. 3A and 3B, in a non-display area "D2(DC)," a CMOS element consists of a positive (p)-type TFT "T(p)" and a negative (n)-type TFT "T(n)."

In a display area "D1," a switching TFT "Ts" and a storage capacitor "Cst" are formed in one pixel region "P." For example, the switching TFT "Ts" includes polysilicon material and is selected from an n-type TFT or a p-type TFT. The n-type TFT is usually utilized as the switching TFT "Ts." The storage capacitor "Cst" may include first to third storage electrodes 40, 54 and 76 and intervening insulating layers 46 and 60 therebetween. The storage capacitor "Cst" includes first and second storage capacitors "C1" and "C2" connected to each other in parallel. Accordingly, the LCD device can obtain enough capacitance without increasing the structural size of the storage electrodes "Cst."

For example, the array substrate may be manufactured through at least nine mask processes that includes doping the storage capacitor, doping with high concentration n-type impurities (n+), and doping with high concentration p-type impurities (p+).

The manufacturing process of the array substrate according to the related art will be explained referring to figures as follows: FIGS. 4A to 4I are schematic cross-sectional view showing a process of fabricating an array substrate in a non-display area for an LCD device according to the related art; FIGS. 5A to 5I are schematic plan views showing a process of fabricating an array substrate in a display area for an LCD device according to the related art; and FIGS. 6A to 6I are schematic cross-sectional views taken along a line "VI-VI" of FIG. 5A to 5I, respectively.

In FIGS. 4A, 5A and 6A, a substrate 30 includes a display area "D1" and a non-display area "D2." The non-display area "D2" may be classified into a first region "A1" and a second region "A2," and the display area "D1" may be classified into a third region "A3" and a fourth region "A4." Here, the third region "A3" and the fourth region "A4" may constitute a pixel region "P."

A buffer layer 32 is formed on the substrate 30.

Next, first, second, third and fourth semiconductor layers 34, 36, 38 and 40 are formed by depositing and crystallizing amorphous silicon material on the buffer layer 32 in the first to fourth regions "A1, A2, A3 and A4," respectively, through a first mask process. Crystallizing the amorphous silicon material may be performed using a laser as a heat transfer means.

In FIG. 6A the third semiconductor layer 38 and the fourth semiconductor layer 40 are formed as one body.

Although not shown, the mask process includes coating a photoresist (PR) material layer, exposing and developing the PR material layer to form a PR pattern.

In FIGS. 4B, 5B and 6B, a first PR pattern 42 is formed on the first to fourth semiconductor layers 34, 36, 38 and 40 through a second mask process. Here, the first PR pattern 42 has an open portion exposing the fourth semiconductor layer 40. Next, the fourth semiconductor layer 40 exposed by the first PR pattern 42 in the fourth region "A4" is doped with high concentration n-type (n+) impurities while the first to third semiconductor layers 34, 36 and 38 are shielded by the first PR pattern 42.

Although not shown, the first PR pattern 42 is removed from the substrate 30 after doping.

In FIGS. 4C, 5C and 6C, a gate insulating layer 46 is formed over an entire surface of the substrate 30. Next, first, second and third gate electrodes 48, 50 and 52 and a first storage electrode 54 are formed on the gate insulating layer 46 through a third mask process. Specifically, the first to third gate electrodes 48, 50 and 52 may be disposed at central portions of the first to third semiconductor layers 34, 36 and 38, respectively.

For example, the gate insulating layer 46 includes an inorganic insulating material such as silicon nitride (SiNx) or silicon oxide (SiOx), or an organic insulating material.

In this step, although not shown, a gate line connected to the third gate electrode 52 is formed and a storage line "SL" extended from the first storage electrode 54 is formed along a second direction parallel to the gate line. Substantially, the storage line "SL" is disposed to pass through the pixel region "P."

In FIGS. 4D, 5D and 6D, a second PR pattern 56, which covers the first gate electrode 48 to correspond to the first semiconductor layer 34, is formed over the substrate 30 through a fourth mask process. That is, the second gate electrode 50, the third gate electrode 52 and the first storage electrode 54 are exposed by the second PR pattern 56.

Accordingly, the second semiconductor layer 36 and the third semiconductor layer 38 are selectively doped by the n(+) impurities while the first semiconductor layer 34 is shielded by the second PR pattern 56.

Although not shown, the second PR pattern 56 is removed from the substrate 30 after the doping.

In FIGS. 4E, 5E and 6E, a third PR pattern 58, which covers the second gate electrode 50 to correspond to the second semiconductor layer 36 and covers the third gate electrode 52 and the first storage electrode 54 to correspond to the third semiconductor layer 38 and the fourth semiconductor layer 40, is formed over the substrate 30 through a fifth mask process.

Accordingly, the exposed portion of the first semiconductor layer 34 is selectively doped with high concentration p-type (p+) impurities.

The doped portions of the first to fourth semiconductor layers 34, 36, 38 and 40 have an ohmic contact property.

Although not shown, the third PR pattern 58 is removed from the substrate 30 after the doping.

In FIGS. 4F, 5F and 6F, an interlayer insulating layer 60 is formed by depositing an inorganic insulating material, such as silicon nitride (SiNx) or silicon oxide (SiOx), over an entire surface of the substrate 30.

In this step, the gate insulating layer 46 and the interlayer insulating layer 60 are etched to form first, second and third contact holes 62, 64 and 66 that expose both end portions of the first to third semiconductor layers 34, 36 and 38, respectively, through a sixth mask process. Specifically, the first to the third contact holes 62, 64 and 66 includes first source and first drain contact holes 62a and 62b, second source and second drain contact holes 64a and 64b and third source and third drain contact holes 66a and 66b, respectively.

In FIGS. 4G, 5G and 6G, first source and first drain electrodes 70a and 70b, second source and second drain electrodes 72a and 72b, third source and third drain electrodes 74a and 74b, and a second storage electrode 76 are formed by depositing and patterning a conductive metallic material layer such as chromium (Cr), molybdenum (Mo), tungsten (W), copper (Cu) or aluminum alloy (AlNd) on the interlayer insulating layer 60 through a seventh mask process. Specifically, the first source and the first drain electrodes 70a and 70b are connected to both of the doped end portions of the first semiconductor layer 34 via the first source and the first drain contact holes 62a and 62b, respectively.

Similarly, the second source and the second drain electrodes 72a and 72b are connected to the both of the doped end portions of the second semiconductor layer 36 via the second source and the second drain contact holes 64a and 64b, respectively. The third second source and the third drain electrodes 74a and 74b are connected to both of the doped end portions of the third semiconductor layer 38 via the third source and the third drain contact holes 66a and 66b, respectively.

Further, the second storage electrode 76 is extended from the third drain electrode 74b and is overlapped with the first storage electrode 54.

The first semiconductor layer 34, the first gate electrode 48, the first source electrode and the first drain electrode 70a and 70b may constitute a p-type thin film transistor "T(p)" in the first region "A1." The second gate electrode 50, the second source electrode and the second drain electrode 72a and 72b may constitute an n-type thin film transistor "T(n)" in the second region "A2." The p-type thin film transistor "T(p)" and the n-type thin film transistor "T(n)" constitute a CMOS element in the non-display area "D2."

In addition, the third gate electrode 52, the third source electrode 74a and the third drain electrode 74b constitute a switching thin film transistor "Ts" in the third region "A3." For example, the switching thin film transistor "Ts" may be an n-type thin film transistor.

Further, the fourth semiconductor layer 40 and the first storage electrode 54 with the gate insulating layer 46 form a first storage capacitor "C1." The first storage electrode "C1" with the interlayer insulating layer 60 form a second storage capacitor "C2" in the fourth region "A4." The first and the second storage capacitors "C1 and C2" constitute a storage capacitor "Cst."

A data line "DL" connected to the third source electrode 74a is formed to cross the gate line "GL" to define the pixel region "P."

In FIGS. 4H, 5H and 6H, a passivation layer 78 is formed over the substrate 30 and has a storage contact hole 80 that exposes a portion of the second storage electrode 76 through an eighth mask process.

In FIGS. 4I, 5I and 6I, a pixel electrode 82 is formed by depositing a transparent conductive material, such as indium tin oxide (ITO) or indium zinc oxide (IZO), on the passivation layer 78 and is disposed in the pixel region "P" through a ninth mask process. The pixel electrode 82 is connected to the second storage electrode 76 via the storage contact hole 80. Because the second storage electrode 76 is extended from the third drain electrode 74b, the pixel electrode 82 is connected to the third drain electrode 74b through the second storage electrode 76.

The second storage electrode 76 may substantially function as a storage electrode after being connected to the pixel electrode 82.

As explained above, the fabricating method of the array substrate according to the related art includes at least nine mask processes, thereby deteriorating the product yield by increasing product costs and product time. Further, because at least nine mask processes may be performed, the rate of defects may increase.

SUMMARY OF THE INVENTION

Accordingly, the present invention is directed to an array substrate for a liquid crystal display (LCD) device and a method of fabricating the same that substantially obviate one or more of the problems due to limitations and disadvantages of the related art.

An advantage of the present invention is to provide an array substrate for an LCD device and a method of fabricating the same by using a reduced number of mask processes.

Another advantage of the present invention is to provide an array substrate for an LCD device and a method of fabricating the same that has an improved product yield because mask processes, production costs and defect rates are reduced.

Additional features and advantages of the invention will be set forth in the description which follows, and in part will be apparent from the description, or may be learned by practice of the invention. These and other advantages of the invention will be realized and attained by the structure and method particularly pointed out in the written description and claims hereof as well as the appended drawings.

To achieve these and other advantages and in accordance with the purpose of the present invention, as embodied and broadly described, a method of fabricating an array substrate for a liquid crystal display device includes: preparing a substrate defining a display area and a non-display area; forming first and second semiconductor layers in the non-display area and third and fourth semiconductor layers in the display area and a first storage electrode on the fourth semiconductor layer through a first mask process; forming a first gate electrode on a central portion of the first semiconductor layer and first and second metal patterns covering the second and the third semiconductor layers and the first storage electrode through a second mask process; doping end portions of the first semiconductor layer exposed by the first gate electrode with high concentration p-type impurities (p+); forming second and third gate electrodes on central portions of the second and third semiconductor layers, respectively, and a second storage electrode over the first storage electrode through a third mask process; doping end portions of the second semiconductor layer exposed by the second gate electrode with high concentration n-type impurities (n+) and doping end portions of the third semiconductor layer exposed by the third gate electrode with low concentration n-type impurities (n−); forming an interlayer insulating layer on the second and third gate electrodes and a first metal electrode through a fourth mask process, the interlayer insulating layer exposing respective doped portions of the first, second and third semiconductor layers; forming first source and first drain electrodes connected to the doped portions of the first semiconductor layer, second source and second drain electrodes connected to the doped portions of the second semiconductor layer, third source and third drain electrodes connected to the doped portions of the third semiconductor layers and a third storage capacitor over the second storage capacitor through a fifth mask process; forming a passivation layer on the first, second and third source and the first, second and third drain electrodes through a sixth mask process, the passivation layer having a contact hole that exposes a portion of one of the third storage electrode and the third drain electrode; and forming a pixel electrode on the passivation layer through a seventh mask process, the pixel electrode connected to one of the third storage electrode and the third drain electrode via the contact hole.

In another aspect of the present invention, an array substrate for a liquid crystal display device includes: a substrate defining a display area and a non-display area; an n-type driving TFT and a p-type driving TFT in the non-display area; a switching TFT in the display area; a storage capacitor in the display area, the storage capacitor including first, second and third storage layers sequentially layered with intervening insulating layers, wherein the first storage layer contacts a first semiconductor layer under the first storage layer; and a pixel electrode in the display area, the pixel electrode connected to the switching TFT.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 1:
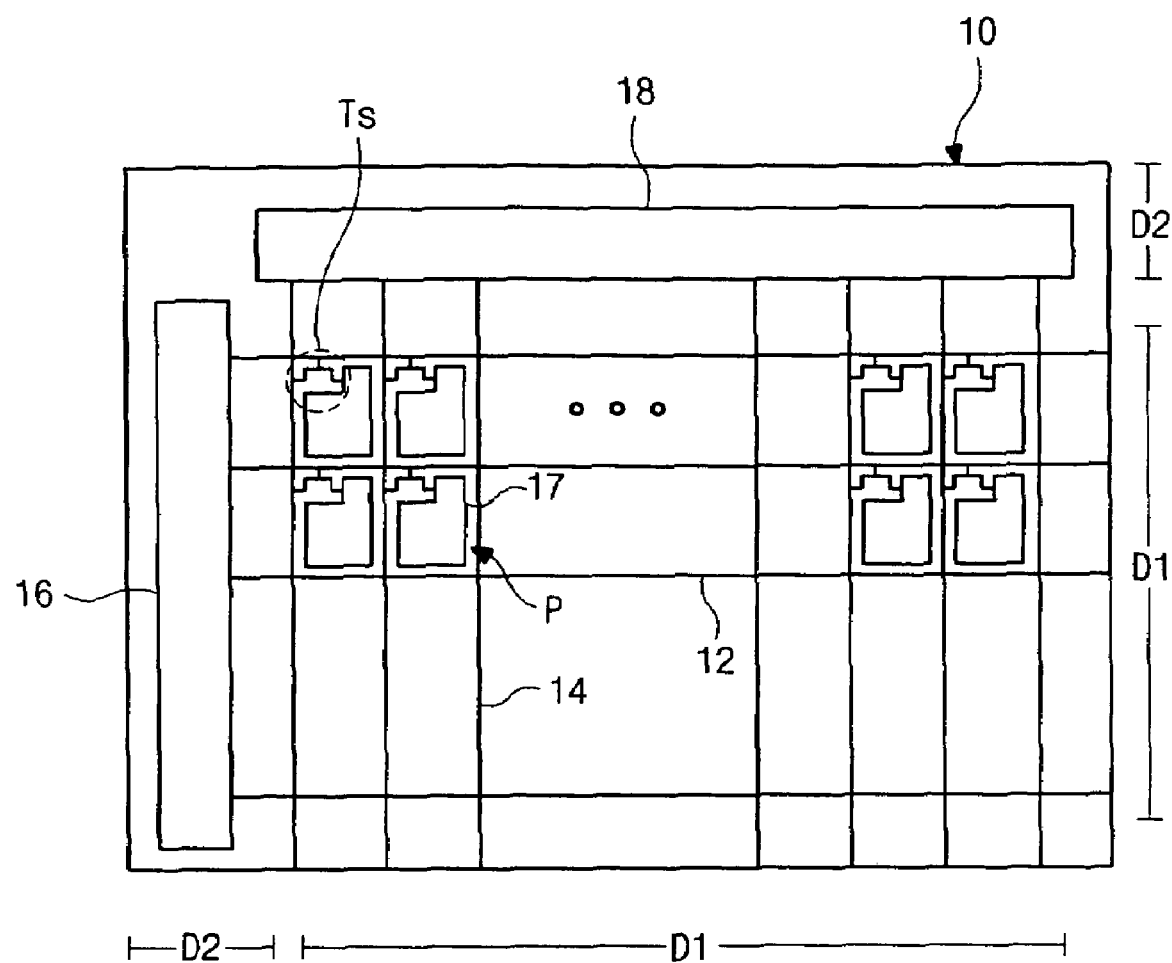
FIG. 1 is a schematic view showing an LCD device according to the related art where a switching element and a driving circuit are formed on a single substrate.
Figure 2:
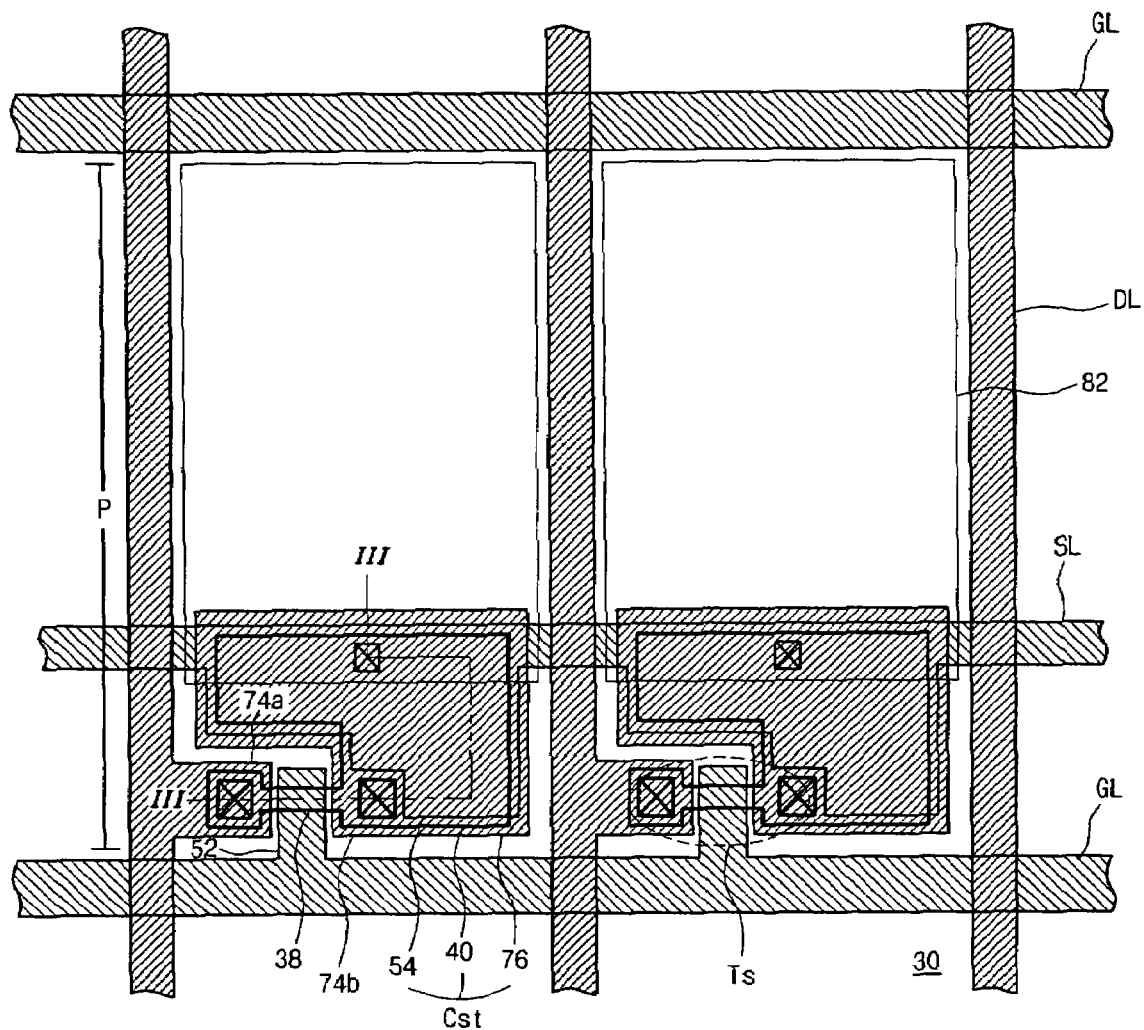
FIG. 2 is a schematic plan view showing a display area of an array substrate for an LCD device according to the related art.
Figure 3A:
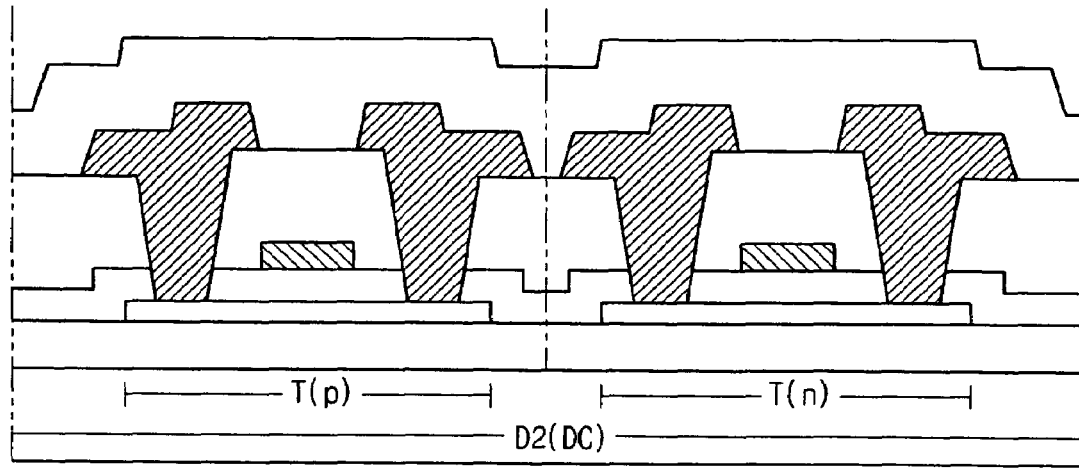
FIG. 3A is a schematic cross-sectional view showing an array substrate for an LCD device according to the related art where a switching element and a driving circuit are formed on a single substrate.
Figure 3B:
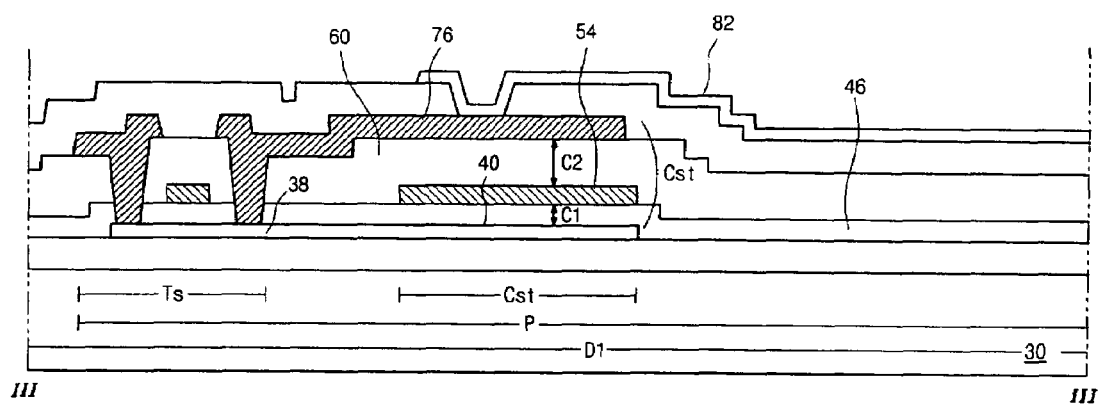
FIG. 3B is a schematic cross-sectional view taken along a line "III-III" of FIG. 2.
Figure 4A:
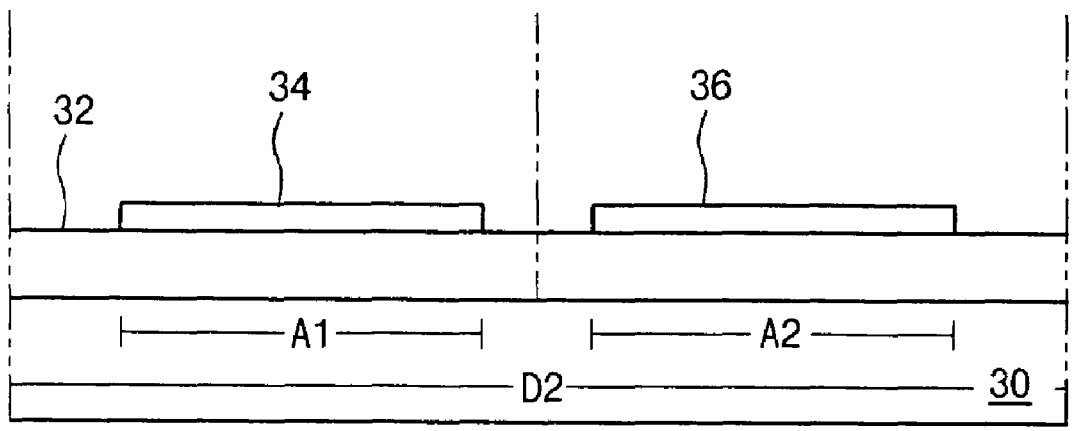
FIGS. 4A, 4B, 4C, 4D, 4E, 4F, 4G, 4H and 4I are schematic cross-sectional views showing a process of fabricating an array substrate in a non-display area for an LCD device according to the related art.
Figure 4B:
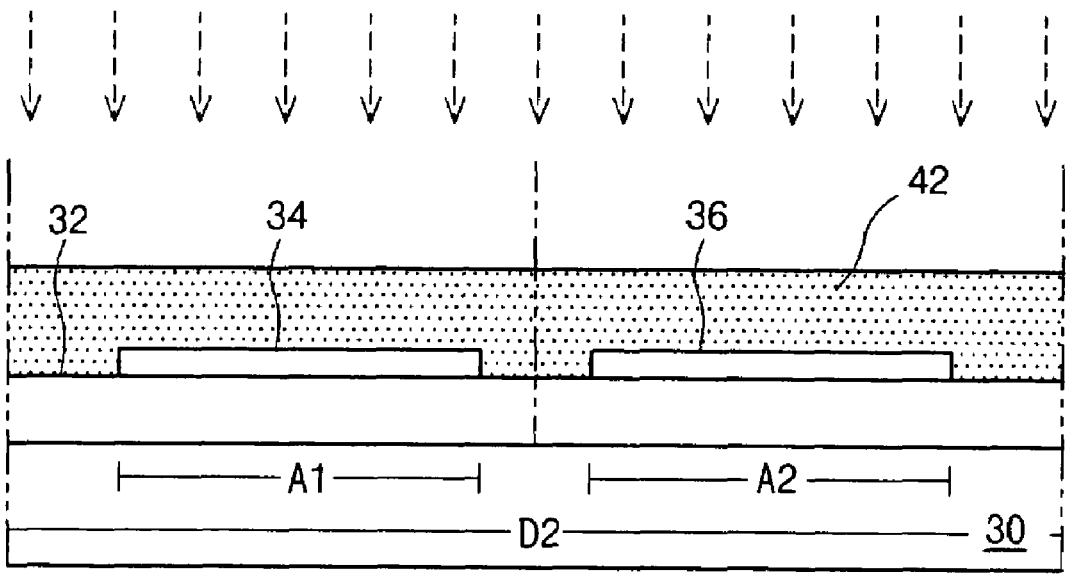
Figure 4C:
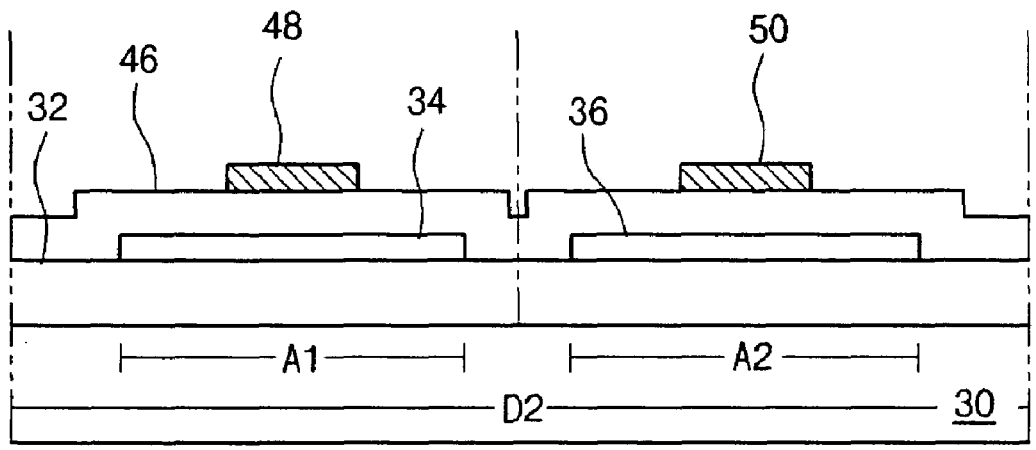
Figure 4D:
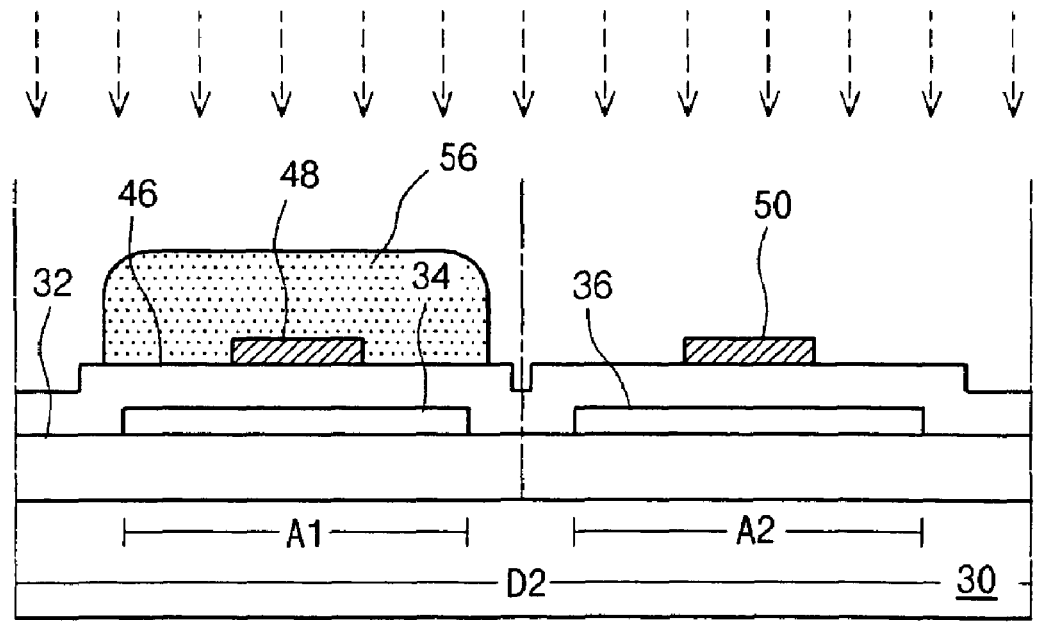
Figure 4E:
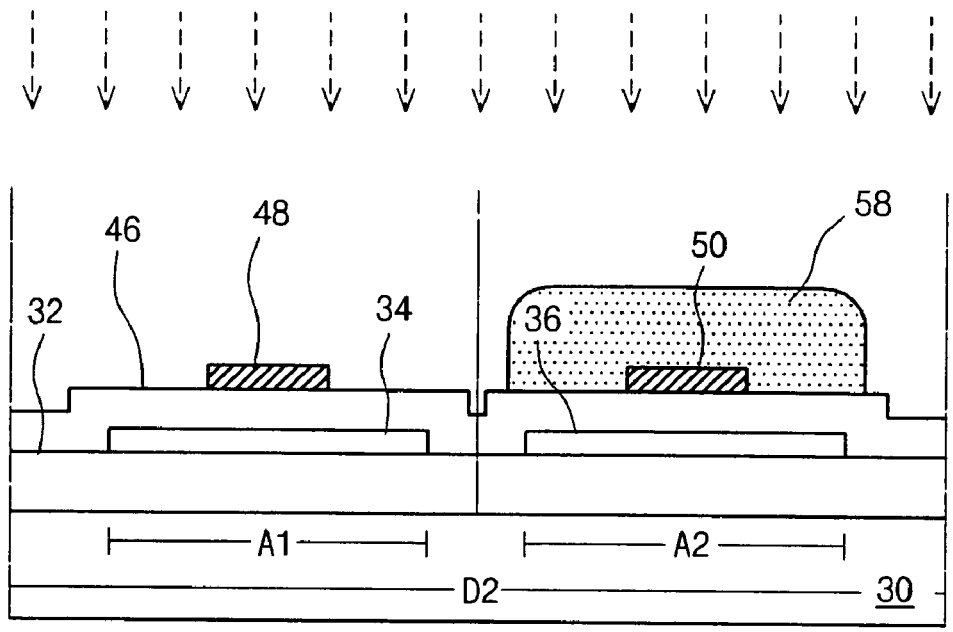
Figure 4F:
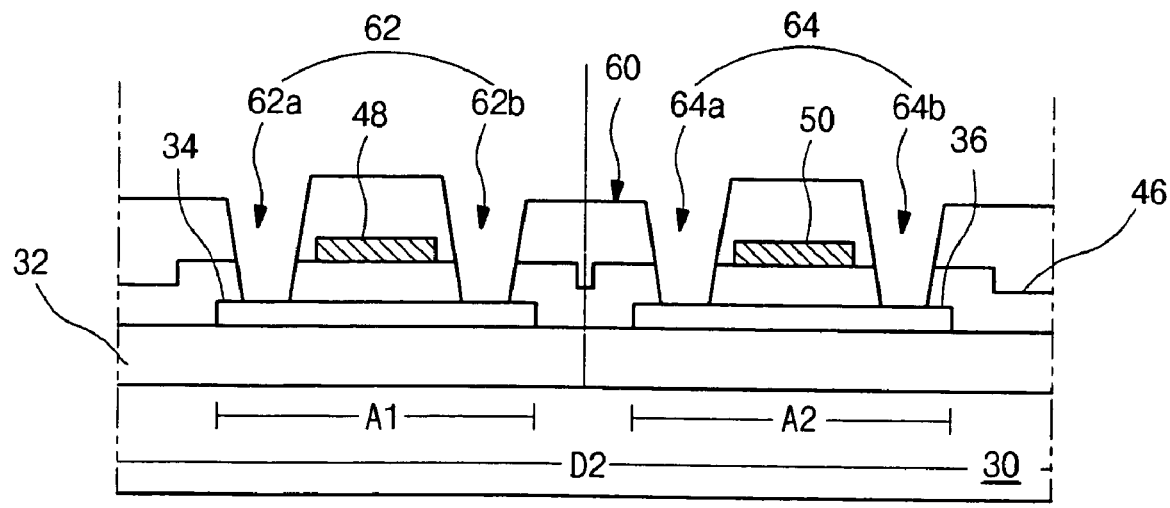
Figure 4G:
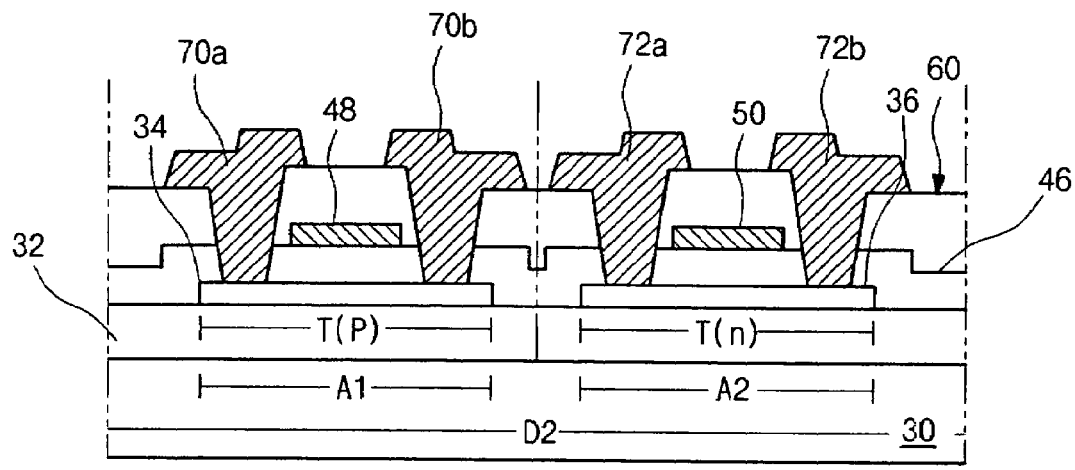
Figure 4H:
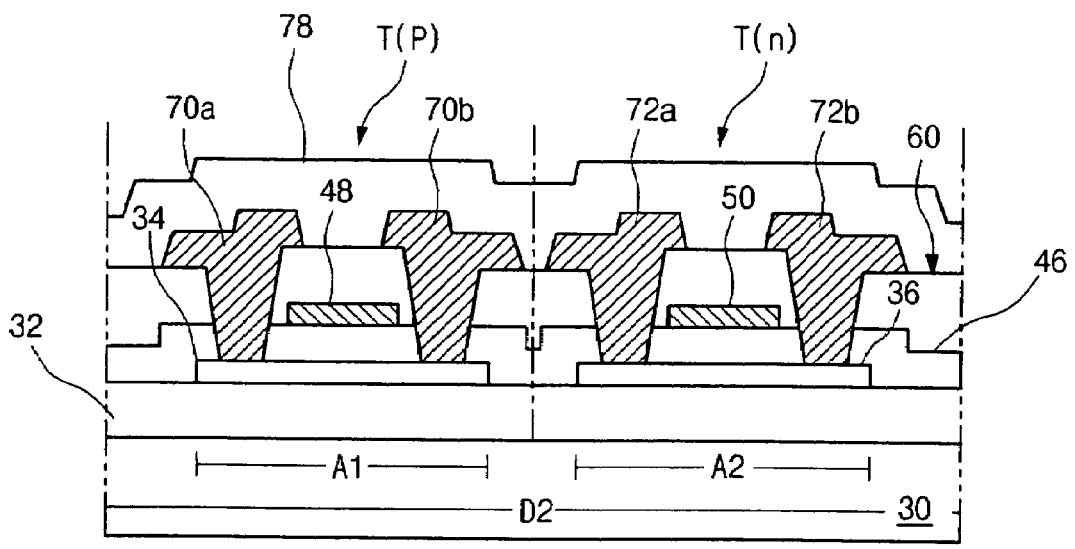
Figure 4I:
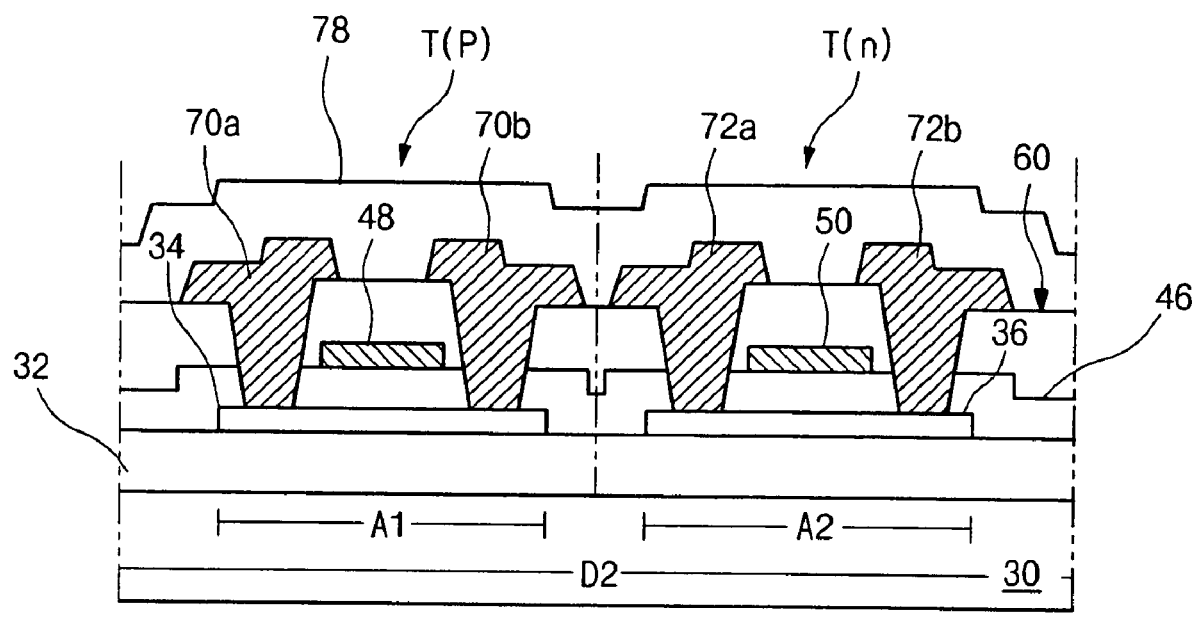
Figure 5A:
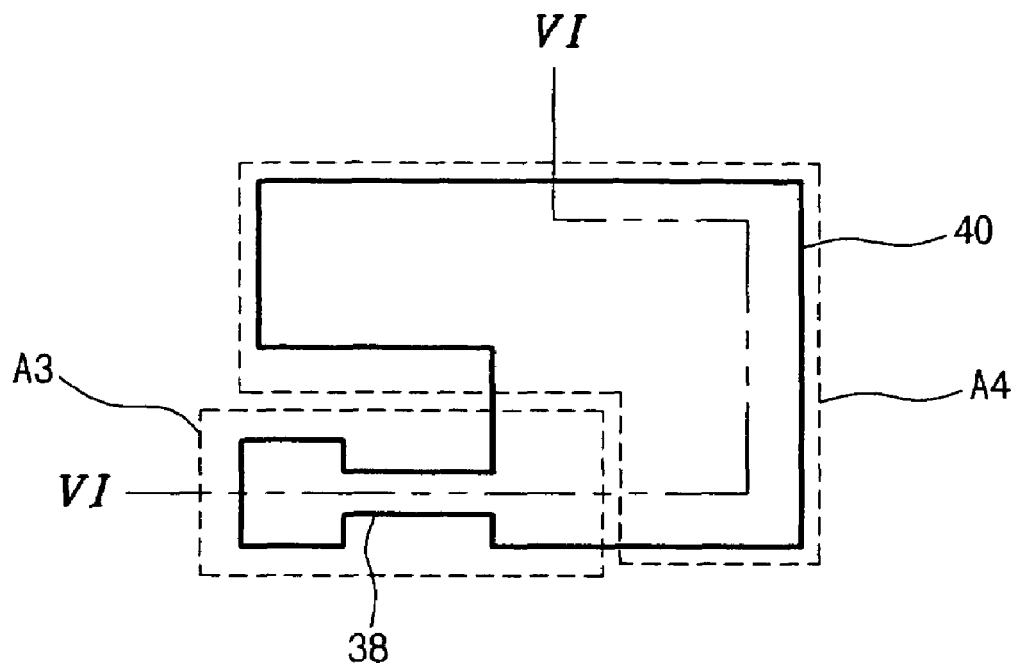
FIGS. 5A, 5B, 5C, 5D, 5E, 5F, 5G, 5H and 5I are schematic plan views showing a process of fabricating an array substrate in a display area for an LCD device according to the related art.
Figure 5B:
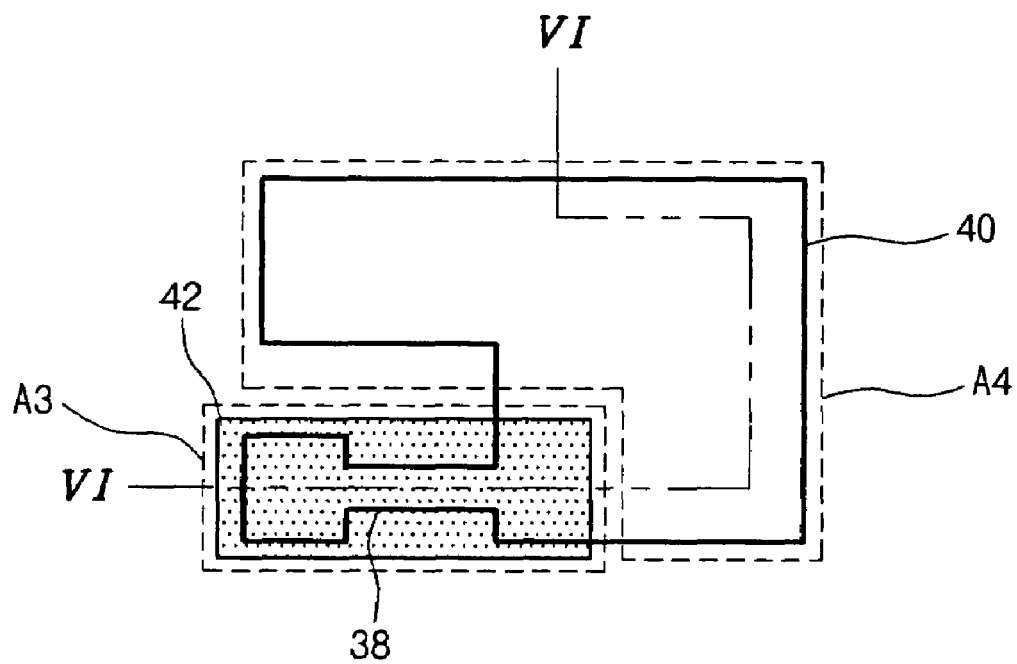
Figure 5C:
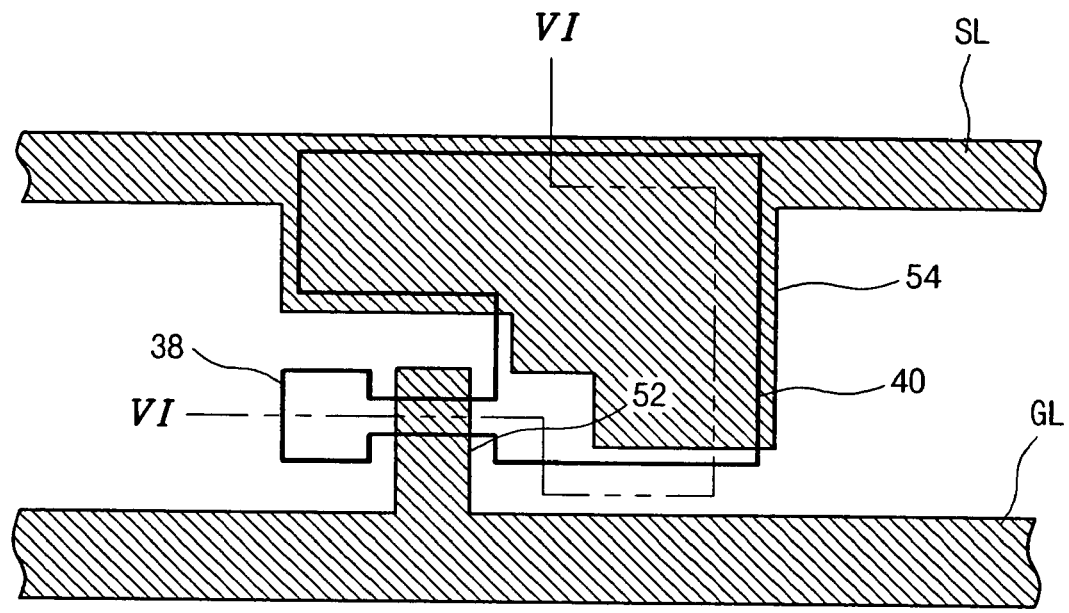
Figure 5D:
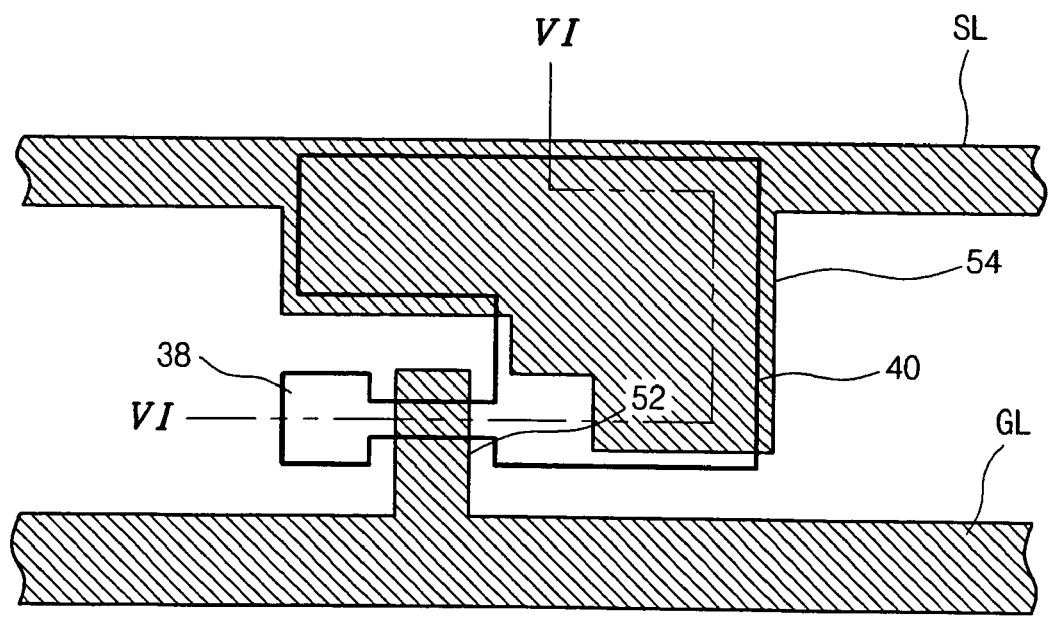
Figure 5E:
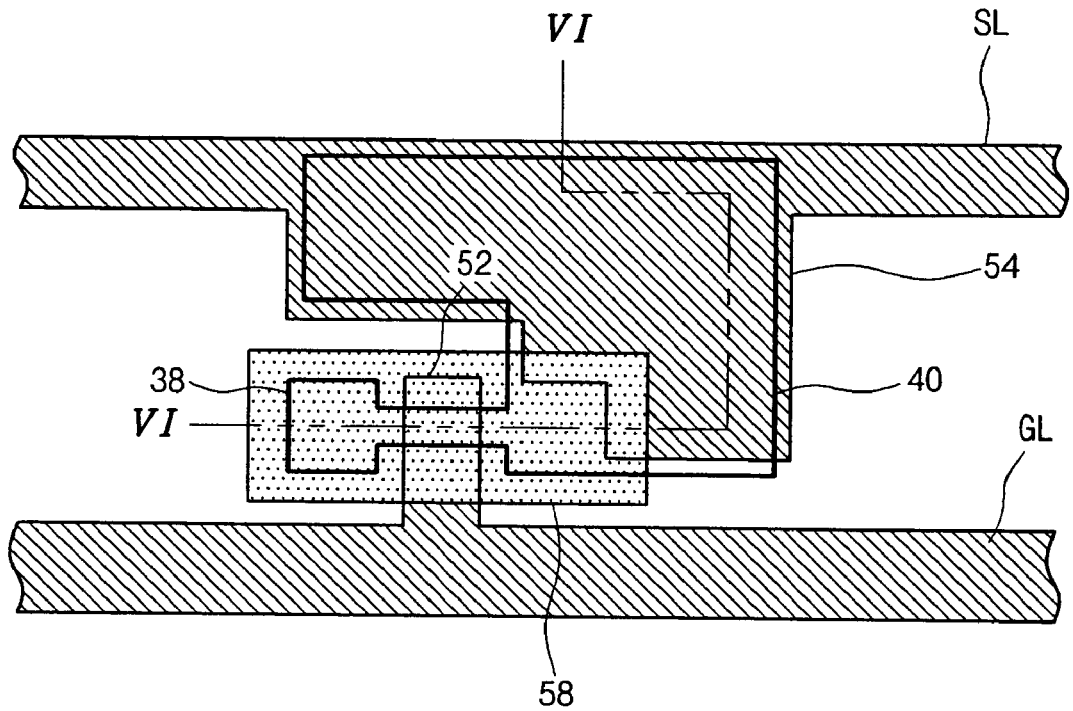
Figure 5F:
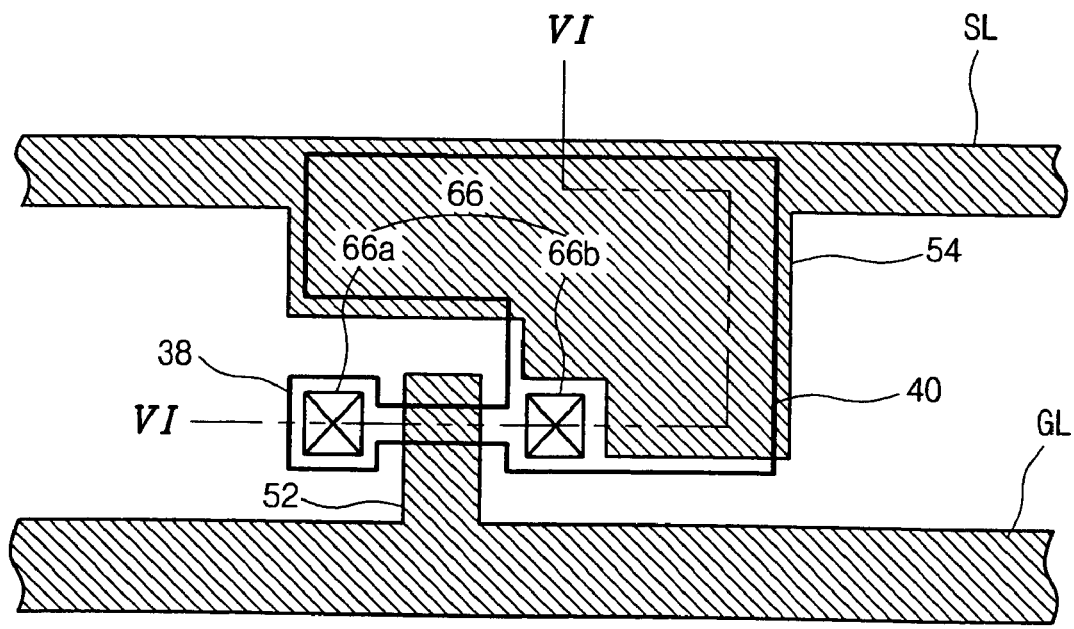
Figure 5G:
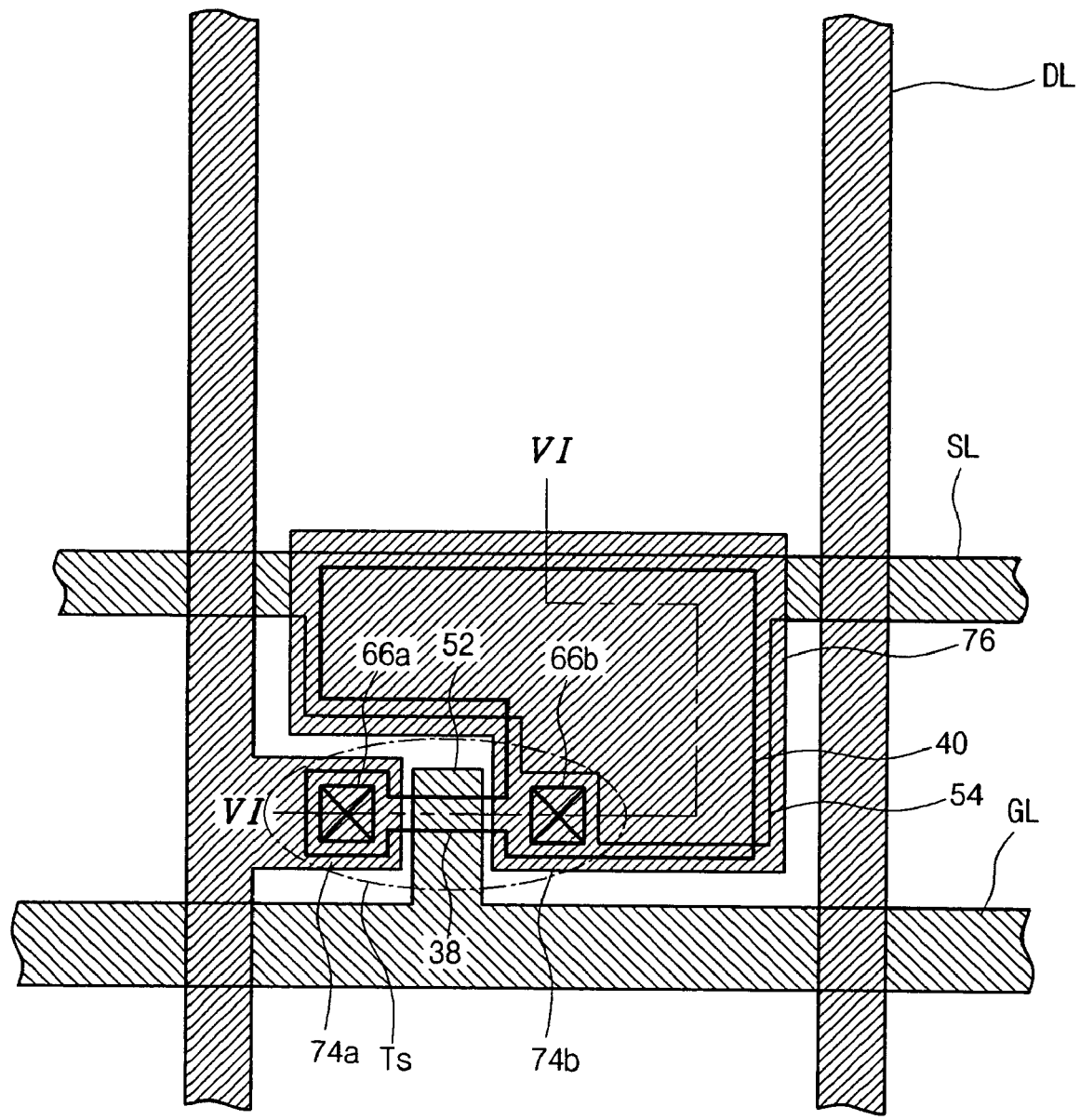
Figure 5H:
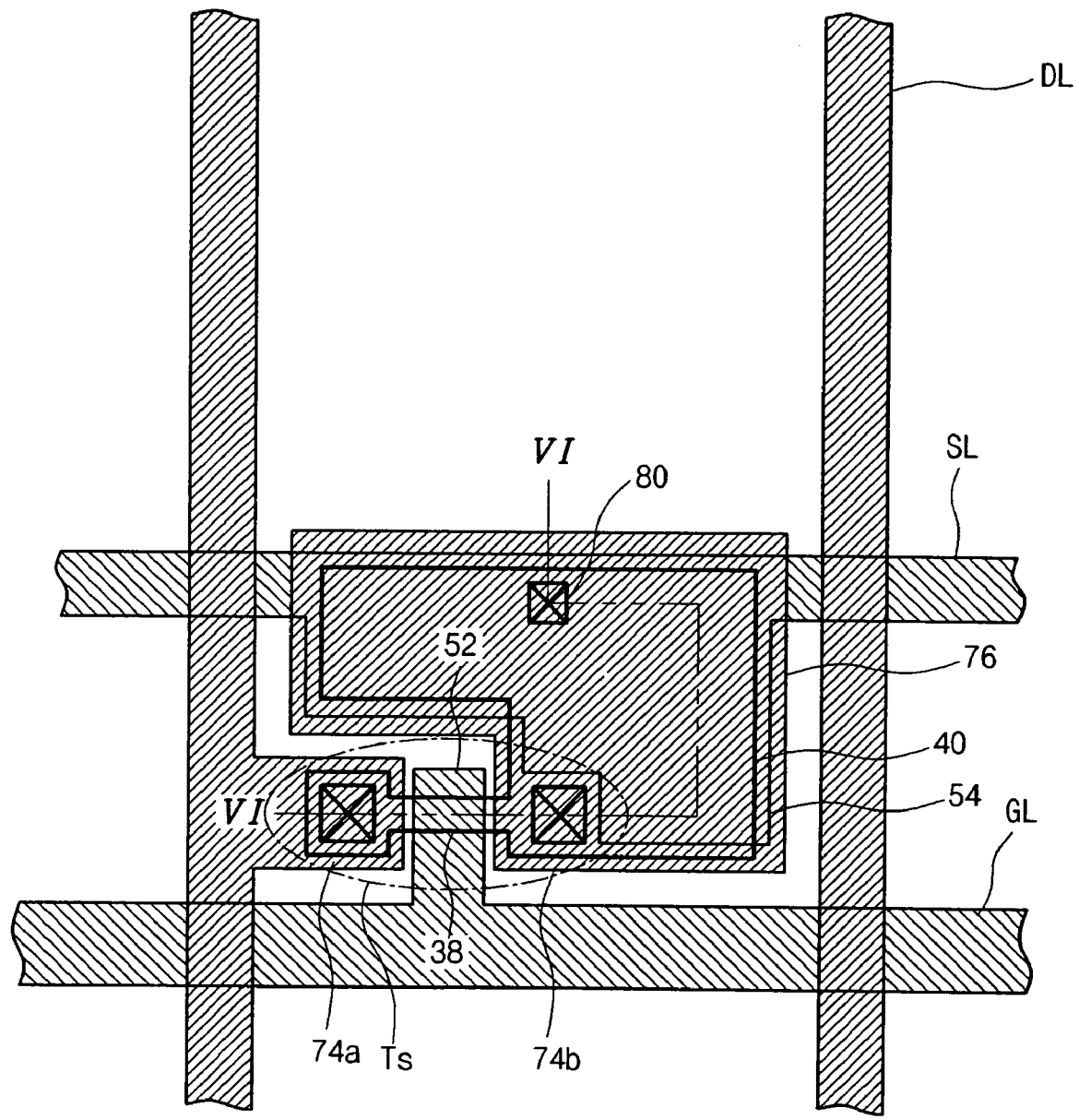
Figure 5I:
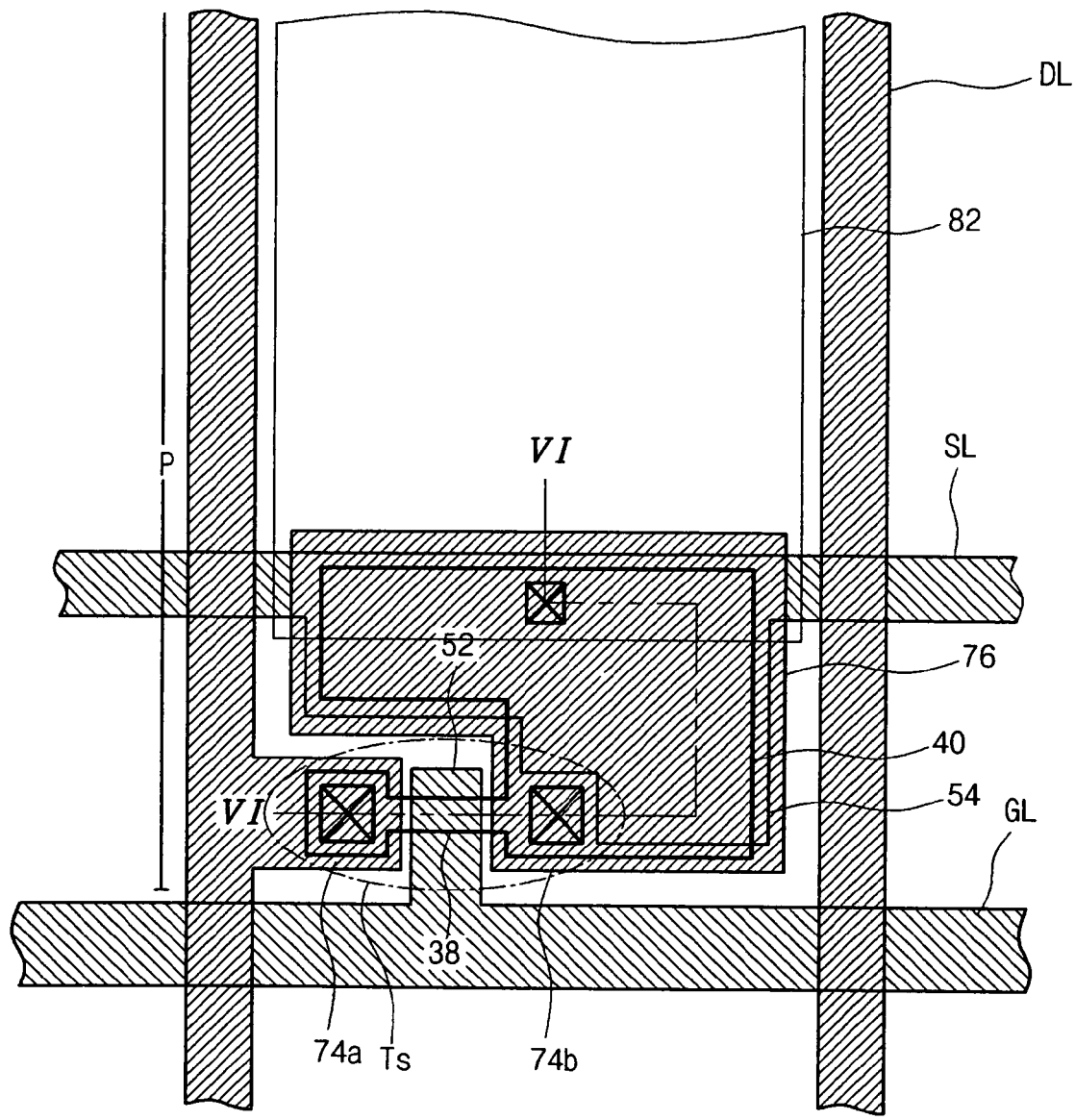
Figure 6A:
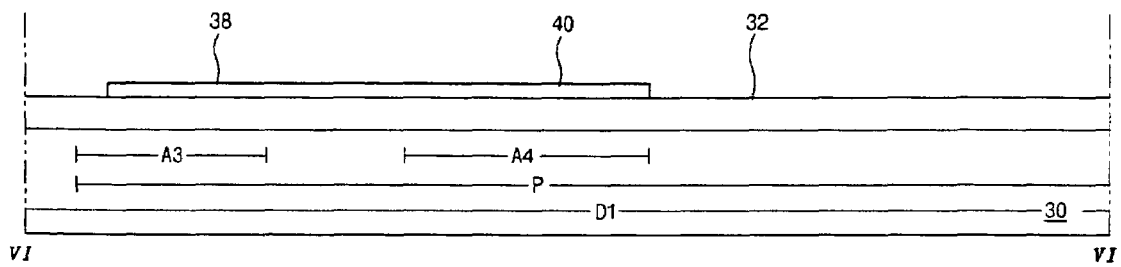
FIGS. 6A, 6B, 6C, 6D, 6E, 6F, 6G, 6H and 6I are schematic cross-sectional views taken along a line "VI-VI" of FIGS. 5A, 5B, 5C, 5D, 5E, 5F, 5G, 5H and 5I, respectively.
Figure 6B:
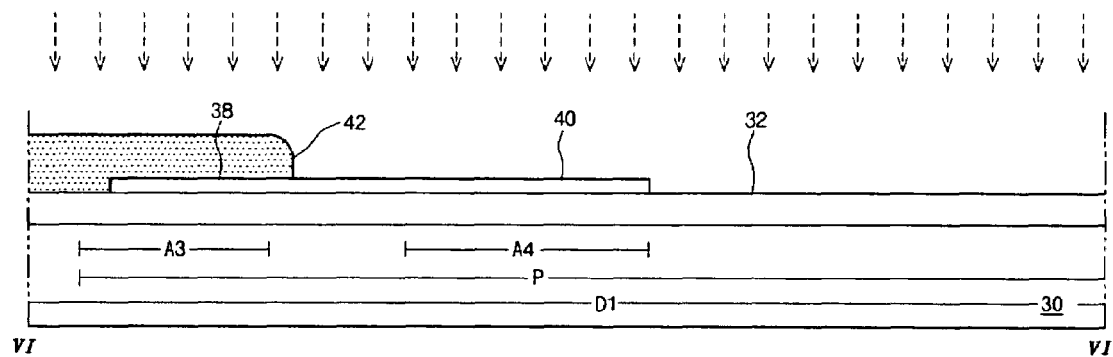
Figure 6C:
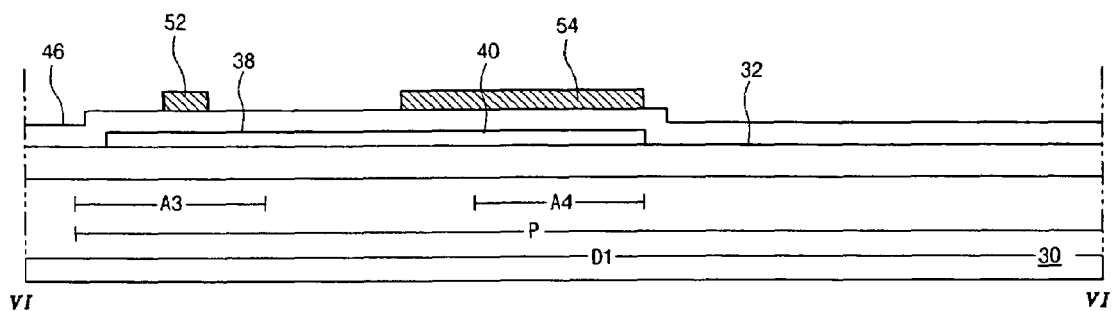
Figure 6D:
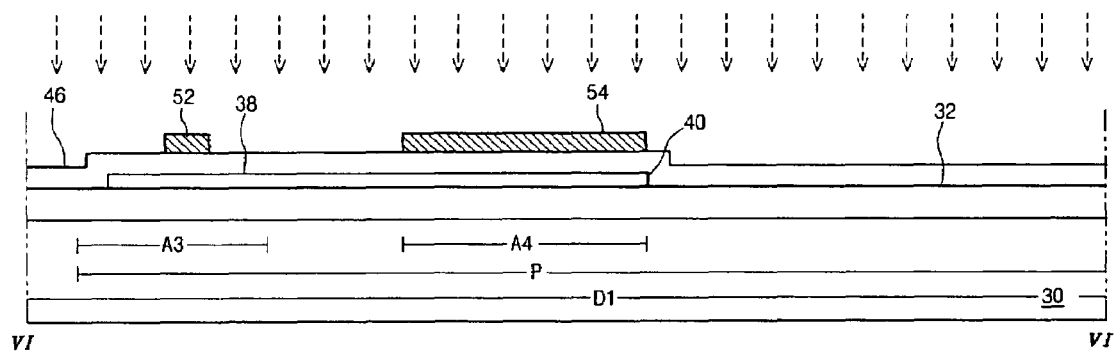
Figure 6E:
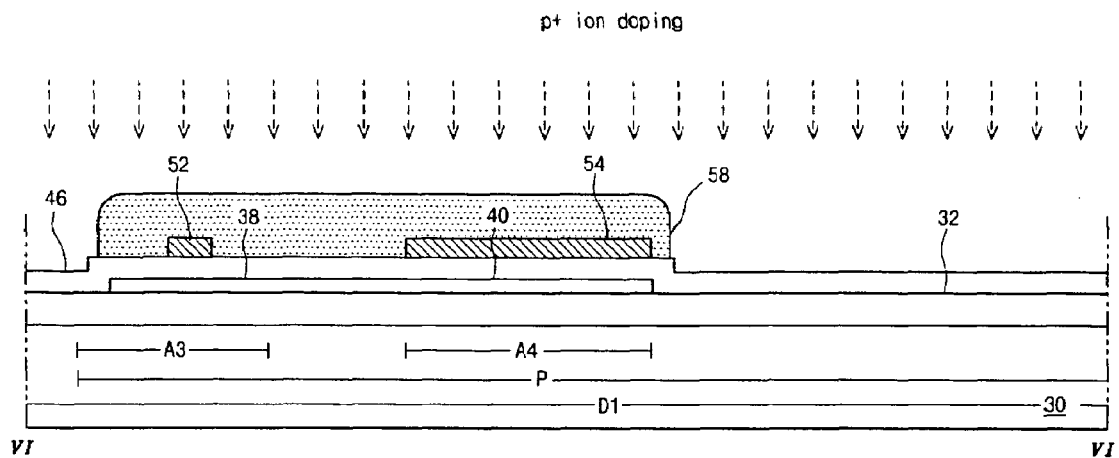
Figure 6F:
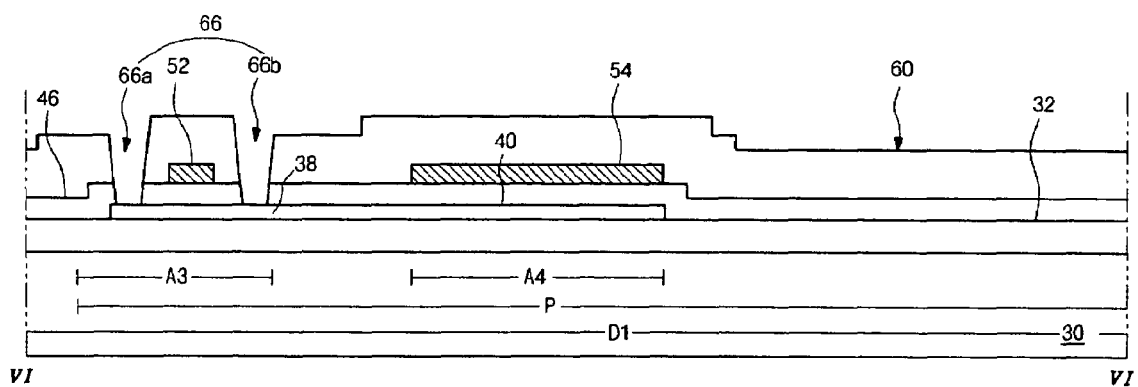
Figure 6G:
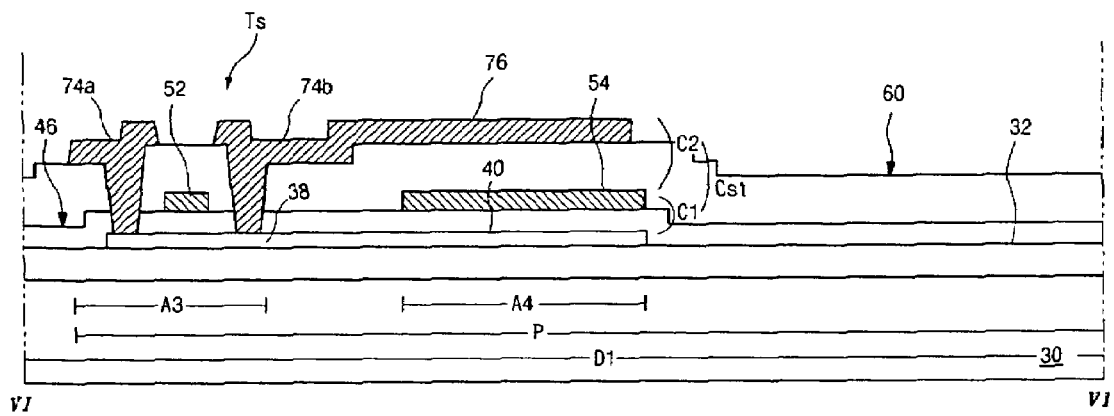
Figure 6H:
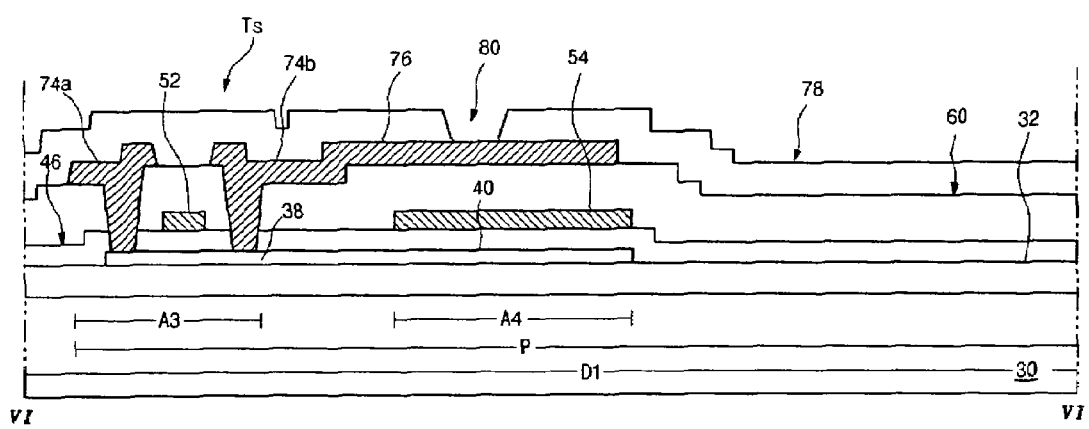
Figure 6I:
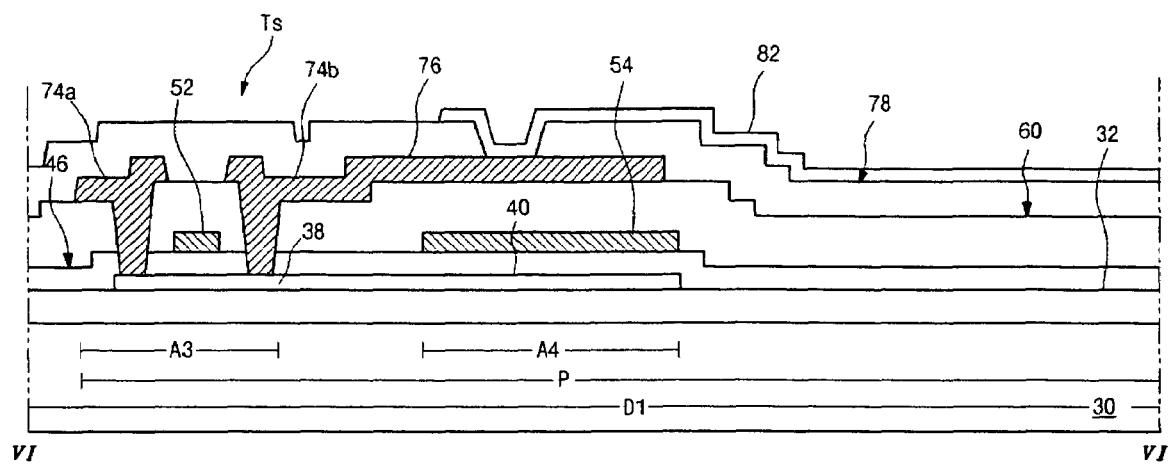
Figure 7:
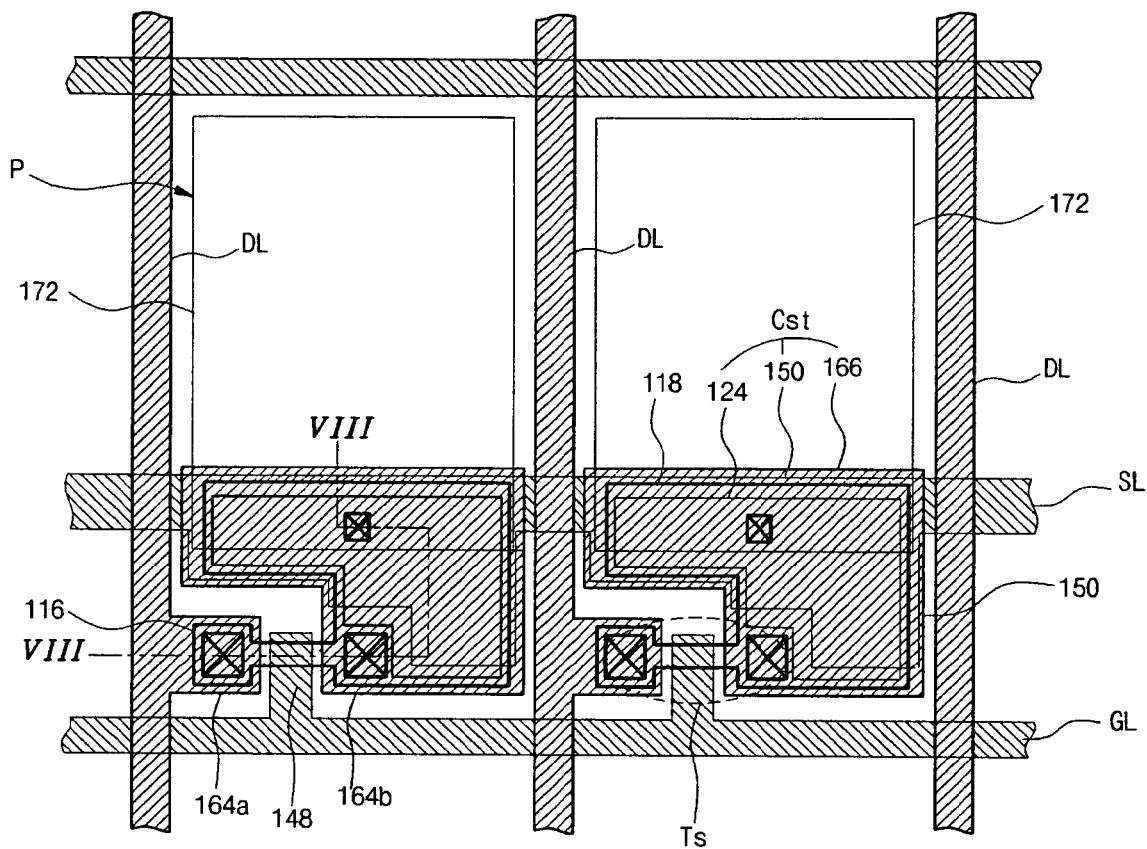
FIG. 7 is a schematic plan view showing a display area of an array substrate for an LCD device according to an embodiment of the present invention.

FIG. 7 is a schematic plan view showing a display area of an array substrate for an LCD device according to an embodiment of the present invention.

In FIG. 7, a gate line "GL" and a data line "DL" cross each other to define a pixel electrode "P." A switching thin film transistor "Ts" is connected to the gate line "GL" and the data line "DL." A pixel electrode 172 is connected to the switching thin film transistor "Ts." For example, the switching thin film transistor "Ts" includes a gate electrode 148, a semiconductor layer 116, a source electrode 164a and a drain electrode 164b. The semiconductor layer 116 may include polysilicon material.

Further, a storage capacitor "Cst" includes first, second and third storage electrodes 124, 150 and 166 with intervening insulating layers. The first storage electrode 124 substantially contacts a semiconductor layer 118 overlapped with the first storage electrode 124. The second storage electrode 150 is extended from a storage line "SL" and the third storage electrode 166 is connected to the pixel electrode 172.

Figure 8A:
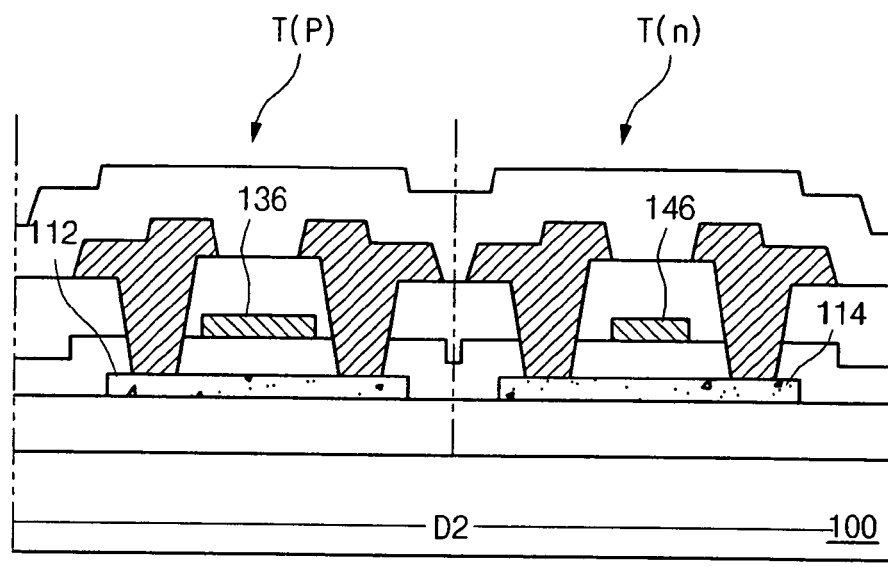
FIG. 8A is a schematic cross-sectional view showing an array substrate for an LCD device according to an embodiment of the present invention where a switching element and a driving circuit are formed on a single substrate.
Figure 8B:
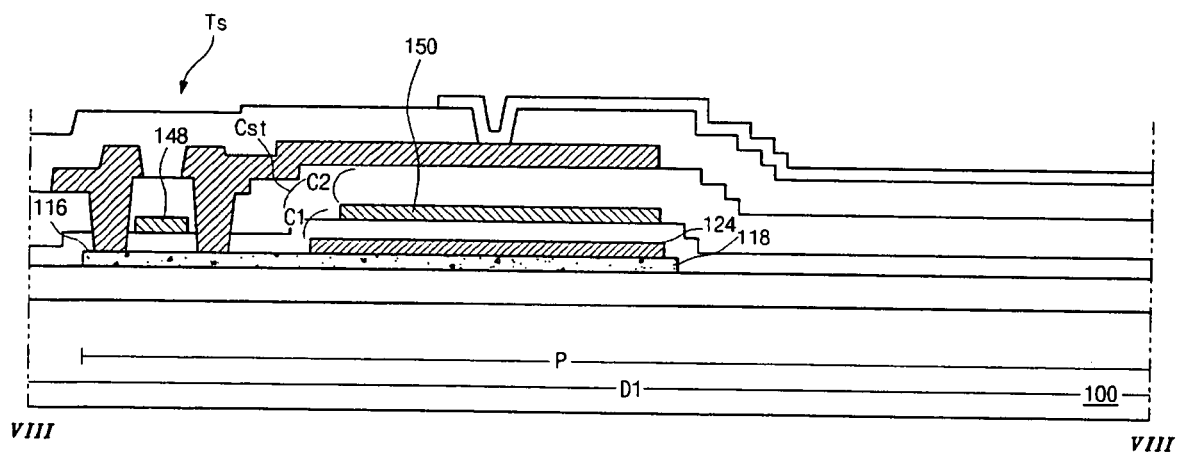
FIG. 8B is a schematic cross-sectional view taken along a line "VIII-VIII" of FIG. 7.

FIGS. 8A and 8B are schematic cross-sectional views showing an array substrate for an LCD device according to an embodiment of the present invention where a switching element and a driving circuit are formed on a single substrate. FIG. 8B is the schematic cross-sectional view taken along a line "VIII-VIII" of FIG. 7.

In FIGS. 8A and 8B, a substrate 100 includes a display area "D1" and a non-display area "D2."

A CMOS element includes a positive (p)-type TFT "T(p)" and a negative (n)-type TFT "T(n)" in a non-display area "D2."

In a display area "D1," a switching TFT "Ts" and a storage capacitor "Cst" are formed in one pixel region "P." For example, the switching TFT "Ts" includes polysilicon material and may be an n-type TFT or a p-type TFT. An n-type TFT is usually utilized as the switching TFT "Ts." In addition, the storage capacitor "Cst" includes a first storage capacitor "C1" and a second storage capacitor "C2" connected to the first storage capacitor "C1" in series. The first storage capacitor "C1" may include a first storage electrode 124 directly contacting a semiconductor layer 118 under the first storage electrode 124. An ohmic contact property exists at a boundary between the first storage electrode 124 and the semiconductor layer 118.

According to an embodiment of the present invention, all of the first, second and third semiconductor layers 112, 114 and 116 of the p-type TFT "T(p)" and the n-type TFT "T(n)," the switching TFT "Ts," the fourth semiconductor layer 118 that contacts the first storage electrode 124, and the first storage electrode 124 on the fourth semiconductor layer 118 are formed through one mask process.

Further, according to an embodiment of the present invention, all of the forming the first, second and third gate electrodes 136, 146 and 148, doping second and third semiconductor layers 114 and 116 of the n-type TFT "T(n)" and the switching TFT "Ts" with high concentration n-type (n+) impurities and with low concentration n-type (n−) impurities, doping the first semiconductor layer 112 of the p-type TFT "T(p)" with high concentration p-type (p+) impurities, and forming the second storage electrode 150 are performed by two mask processes less than that of the related art.

That is, the array substrate for the LCD device according to an embodiment of the present invention can be manufactured through seven mask processes as opposed to the at least nine processes required in the related art.

Figure 9A:
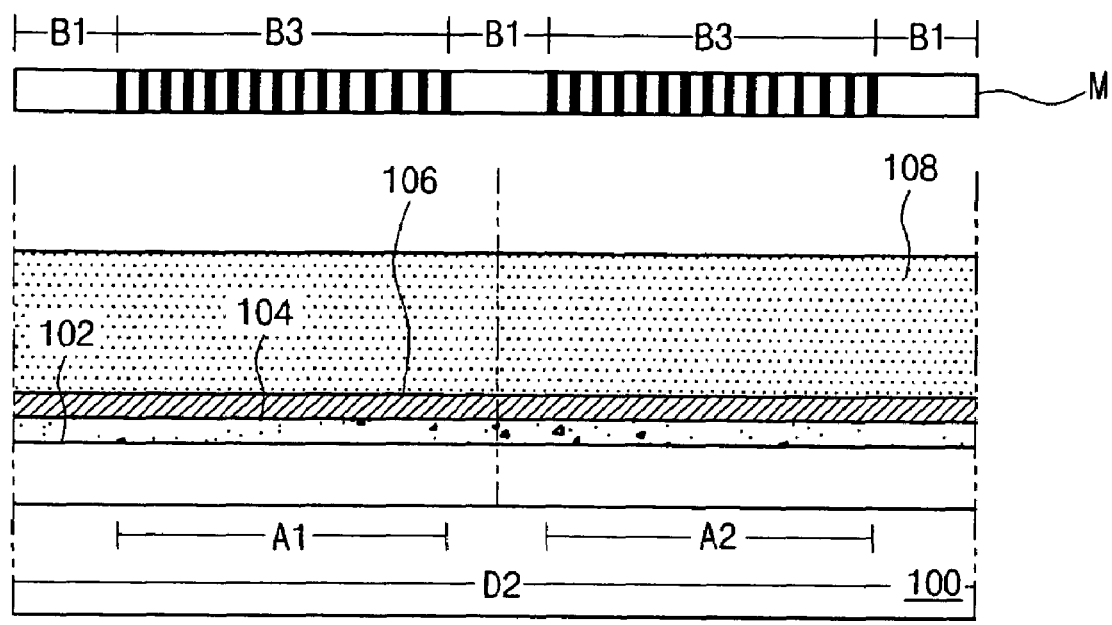
FIGS. 9A, 9B, 9C, 9D, 9E, 9F, 9G, 9H, 9I, 9J, 9K, 9L, 9M, 9N and 9O are schematic cross-sectional views showing a process of fabricating an array substrate in a non-display area for an LCD device according to an embodiment of the present invention.
Figure 9B:
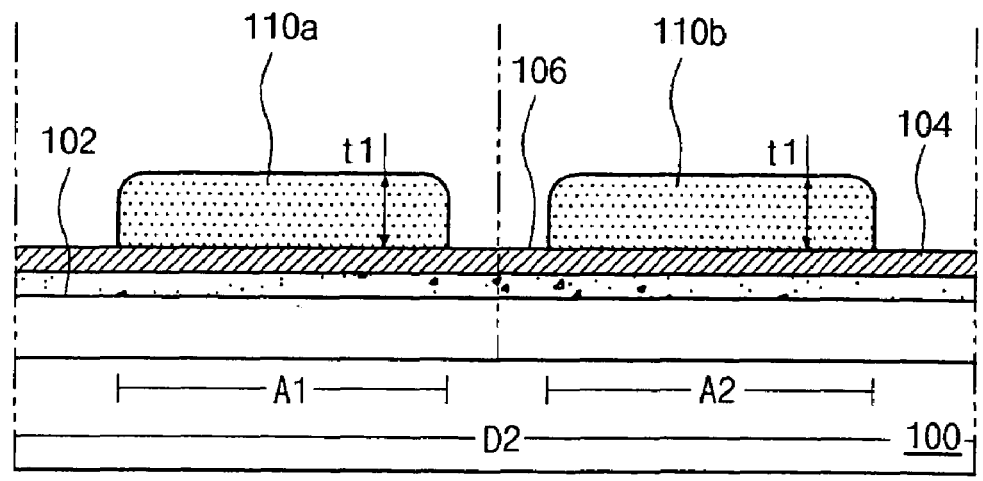
Figure 9C:
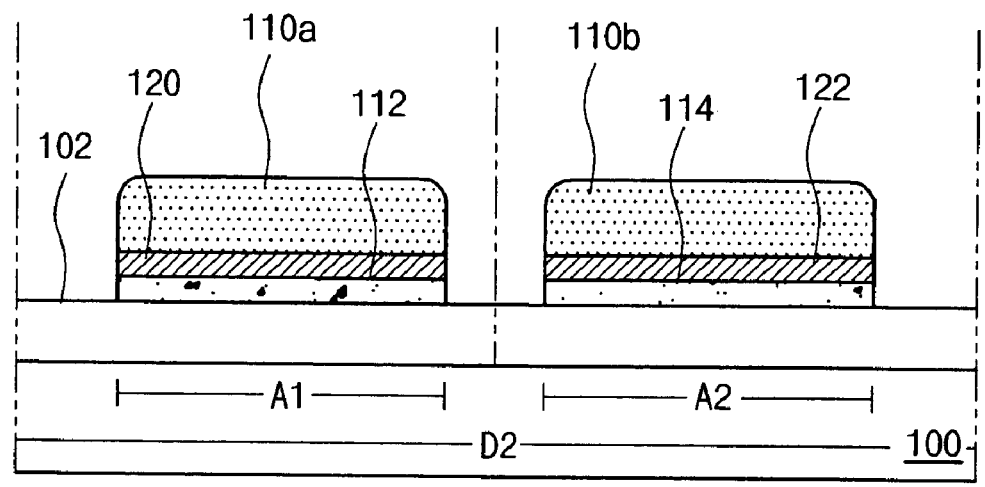
Figure 9D:
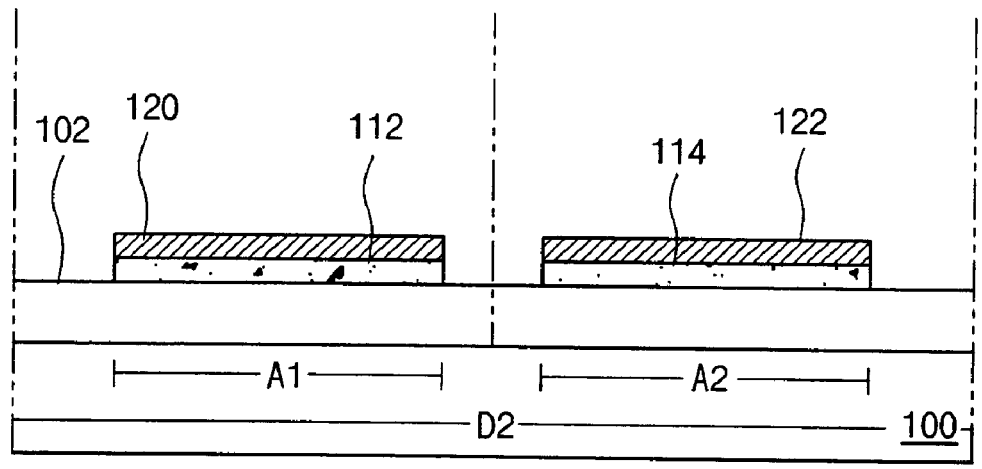
Figure 9E:
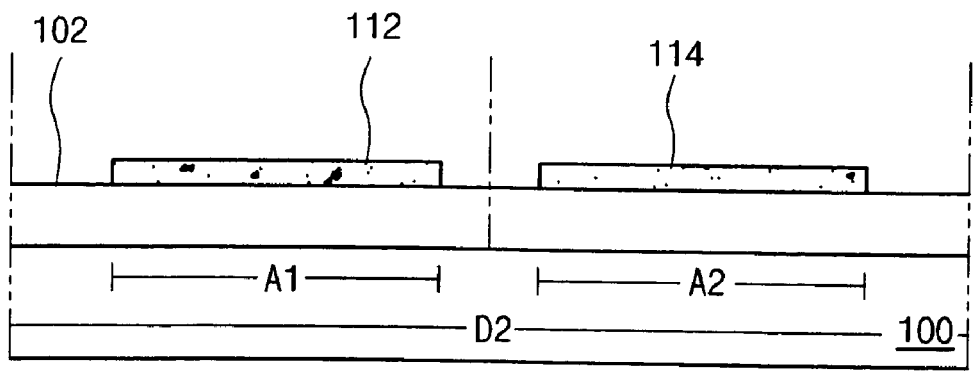
Figure 9F:
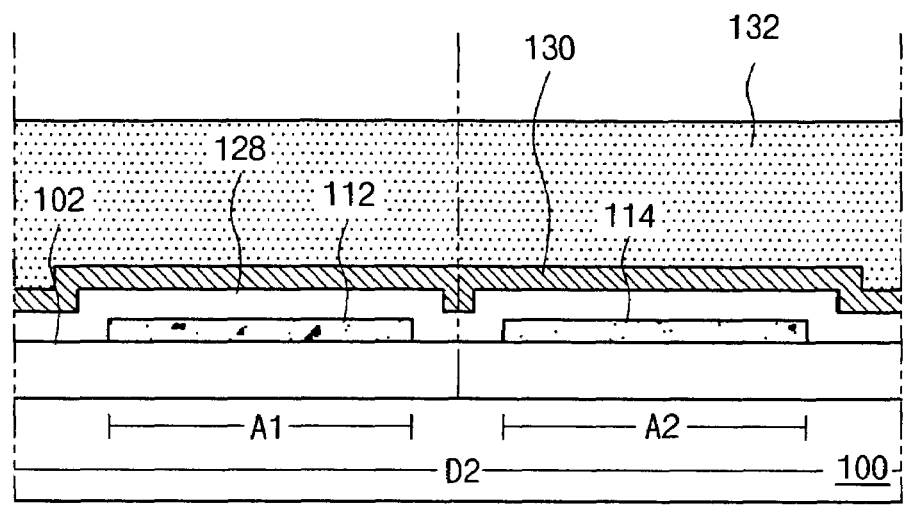
Figure 9G:
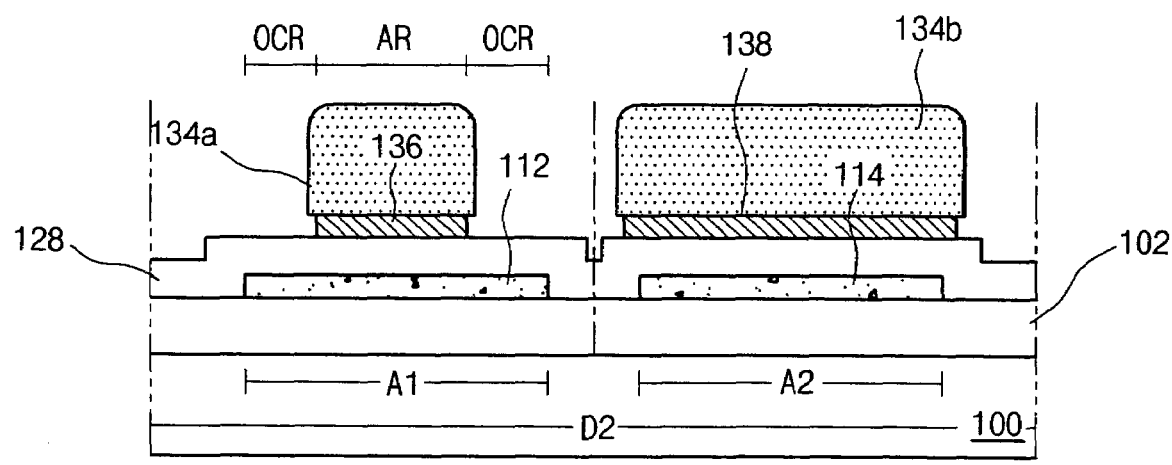
Figure 9H:
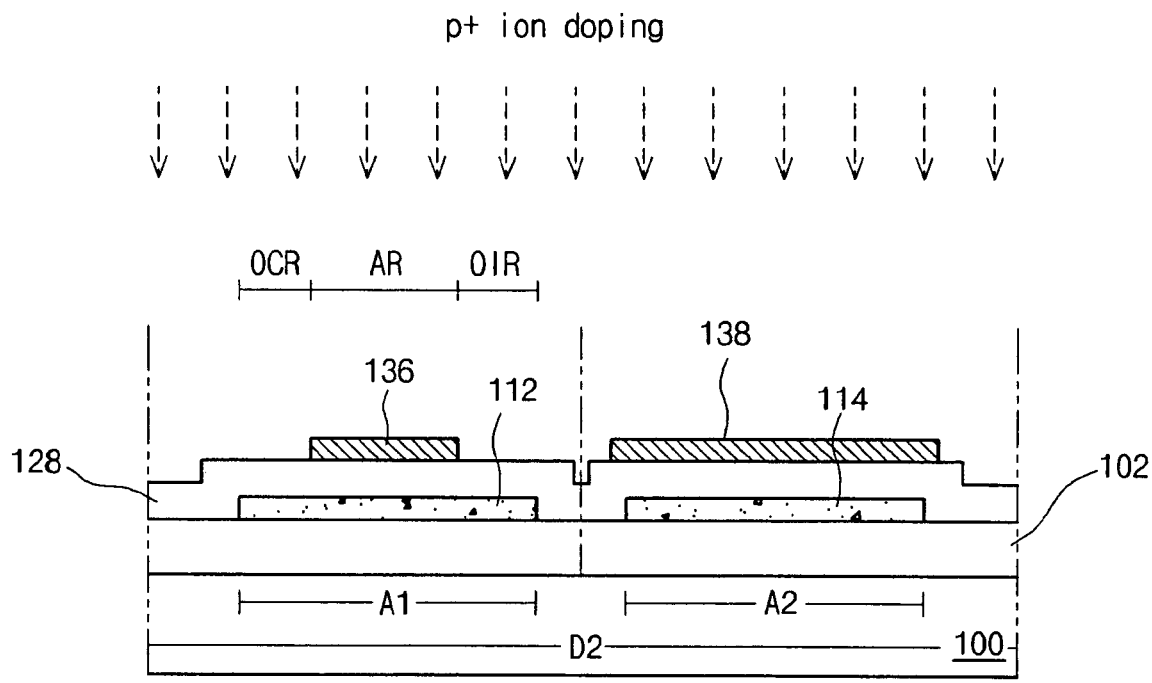
Figure 9I:
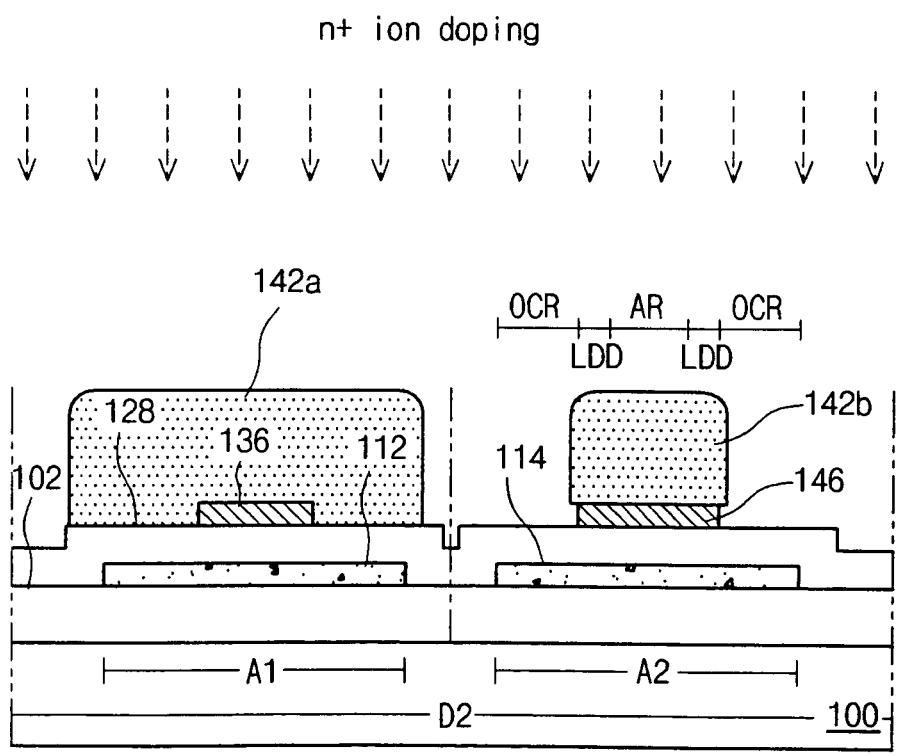
Figure 9J:
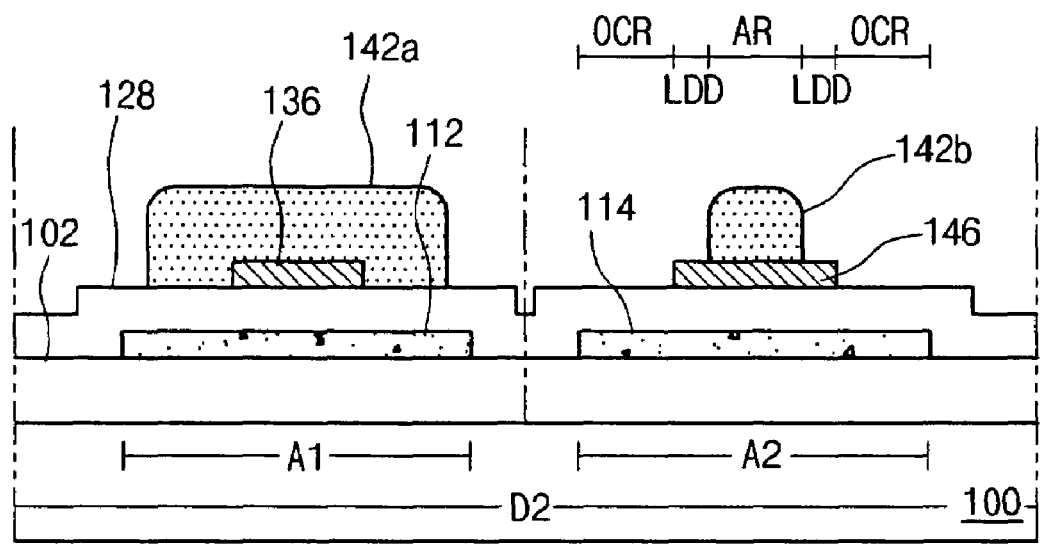
Figure 9K:
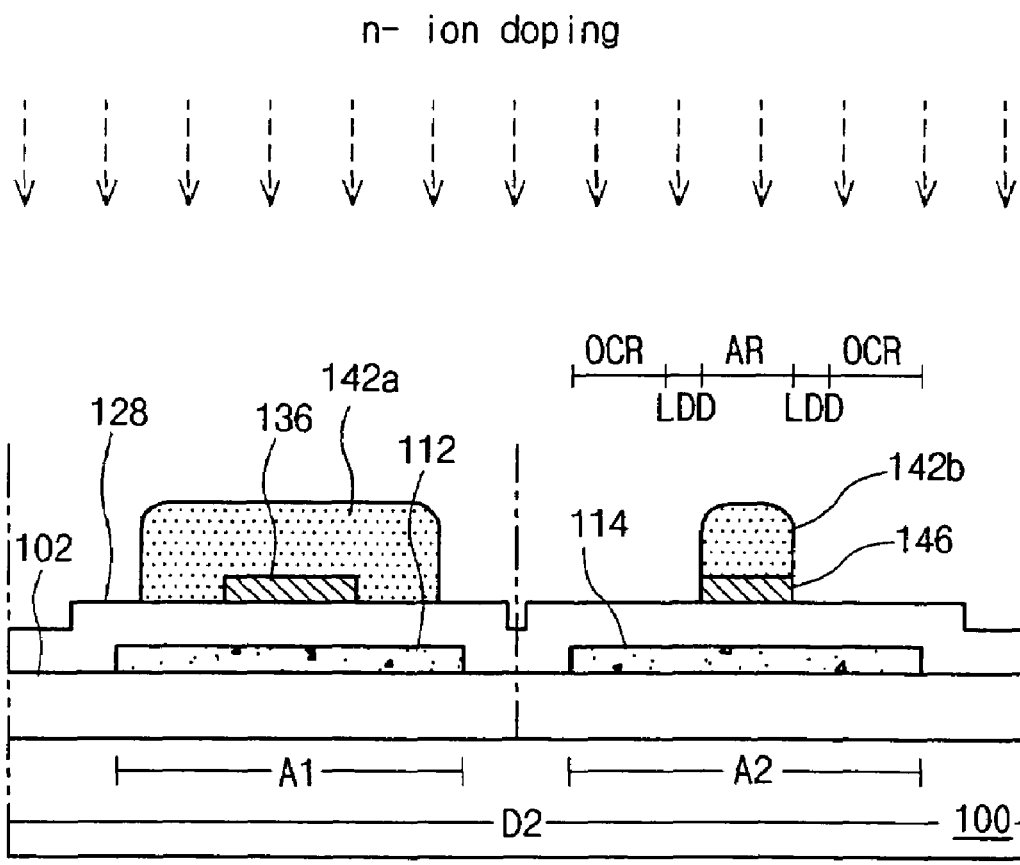
Figure 9L:
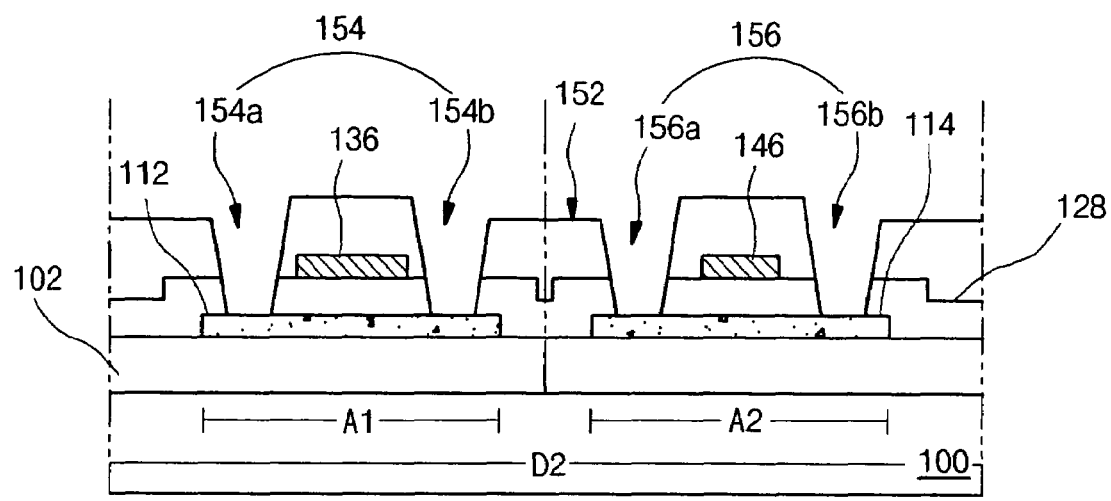
Figure 9M:
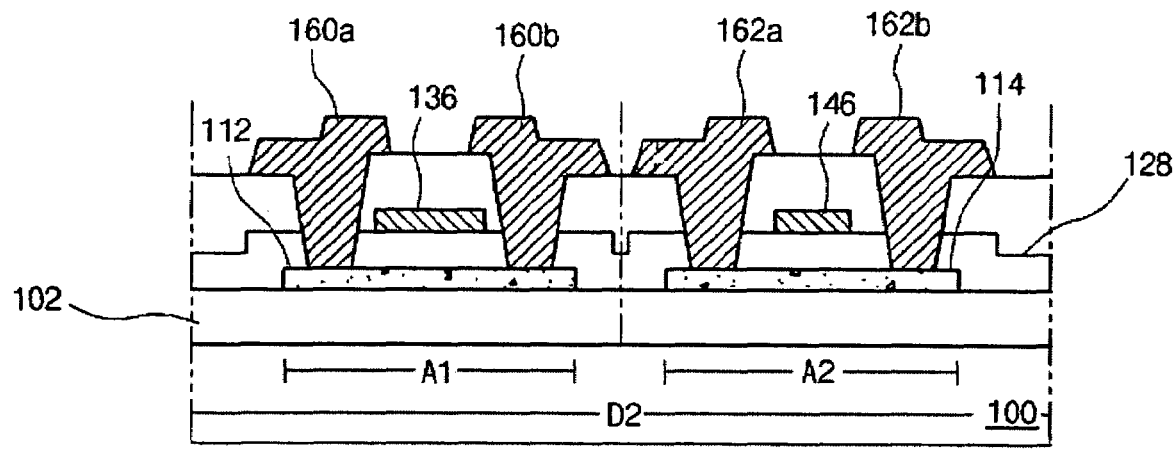
Figure 9N:
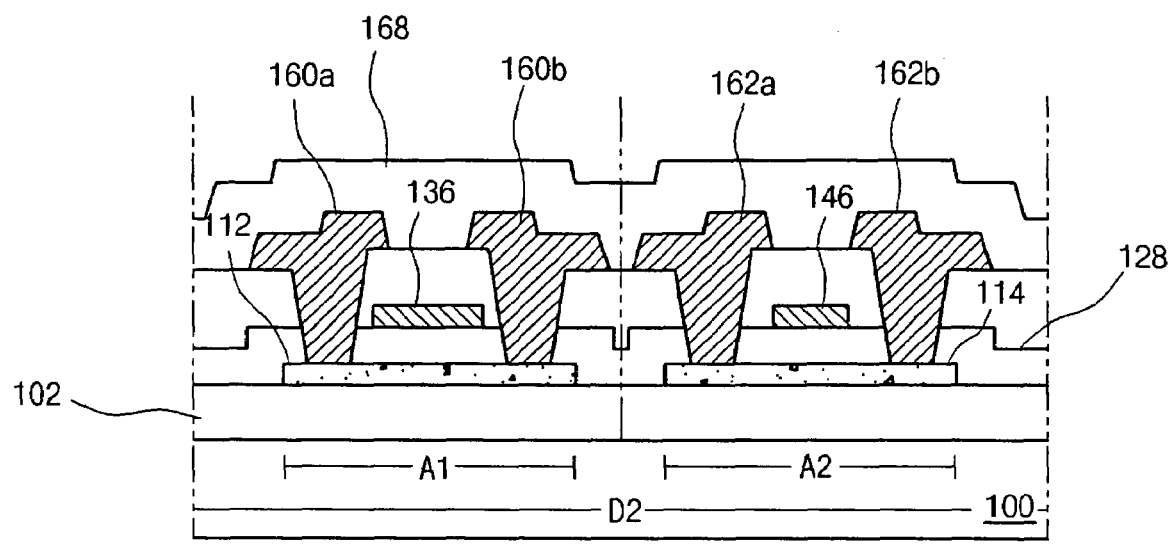
Figure 9O:
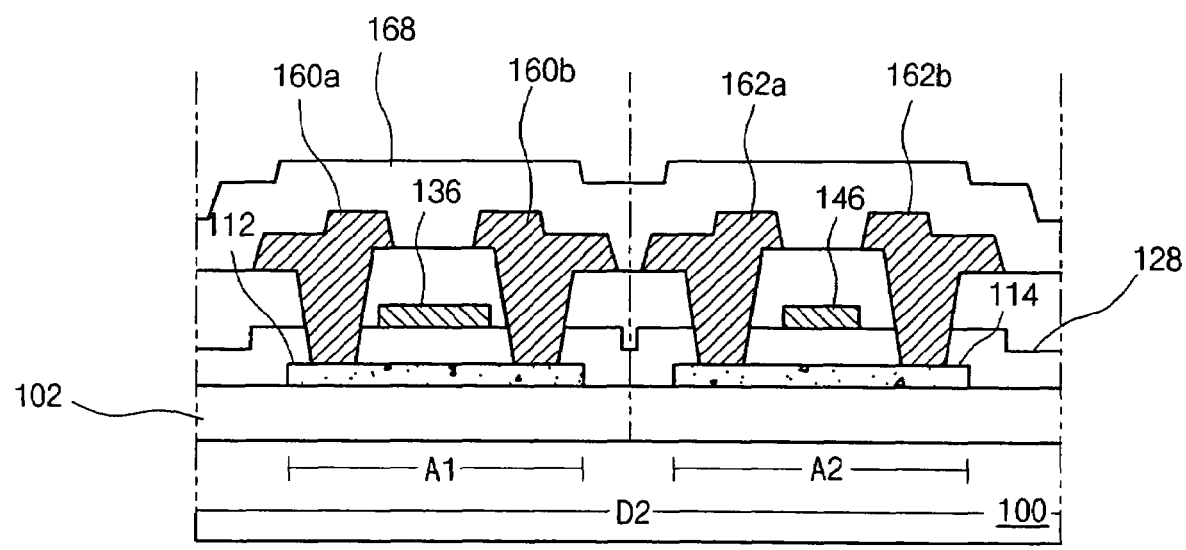

FIGS. 9A to 9O are schematic cross-sectional views showing a process of fabricating an array substrate in a non-display area for an LCD device according to an embodiment of the present invention.

Figure 10A:
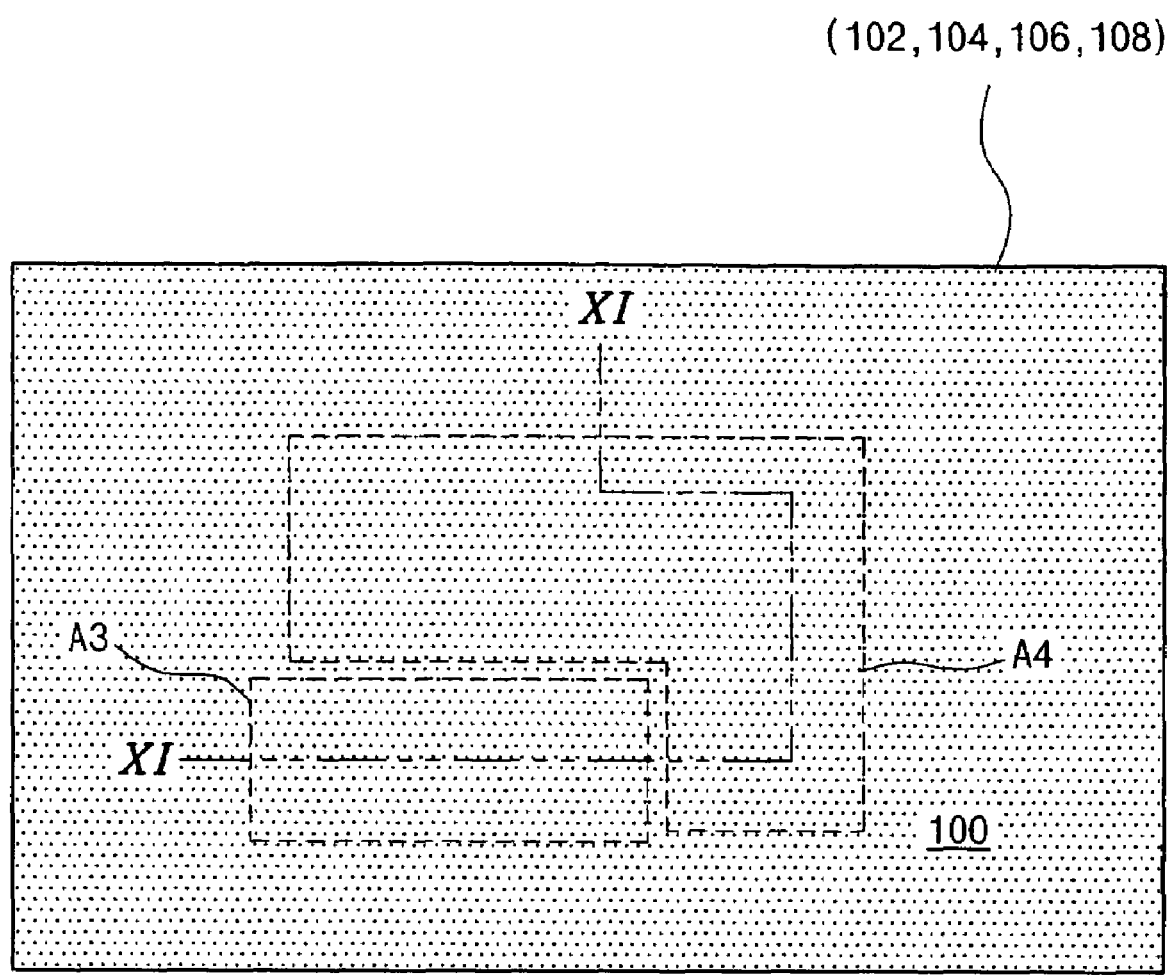
FIGS. 10A, 10B, 10C, 10D, 10E, 10F, 10G, 10H, 10I, 10J, 10K, 10L, 10M, 10N and 10O are schematic plan views showing a process of fabricating an array substrate in a display area for an LCD device according to an embodiment of the present invention.
Figure 10B:
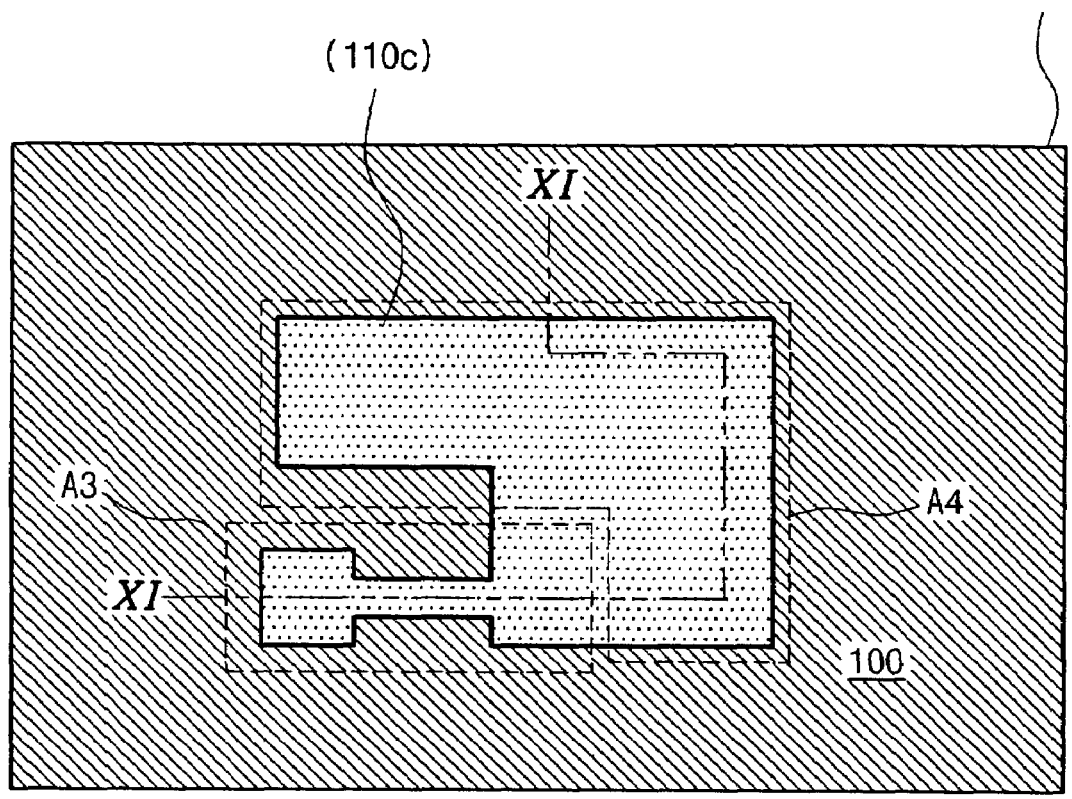
Figure 10C:
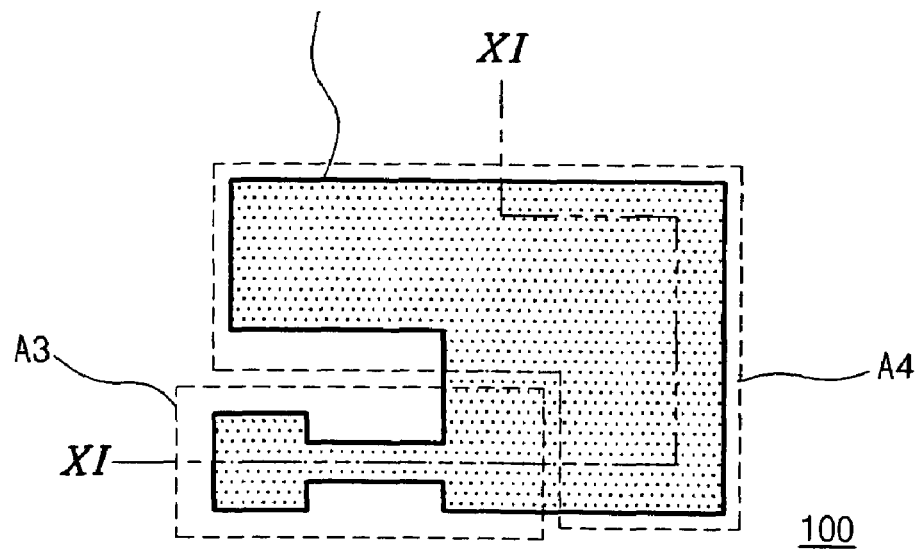
Figure 10D:
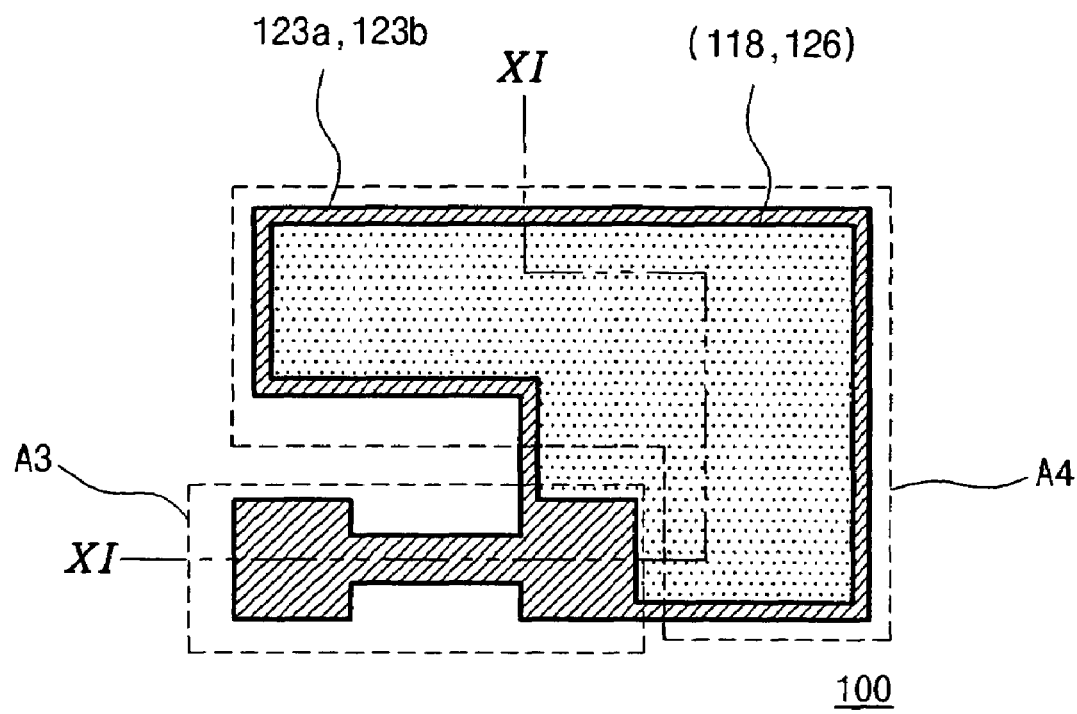
Figure 10E:
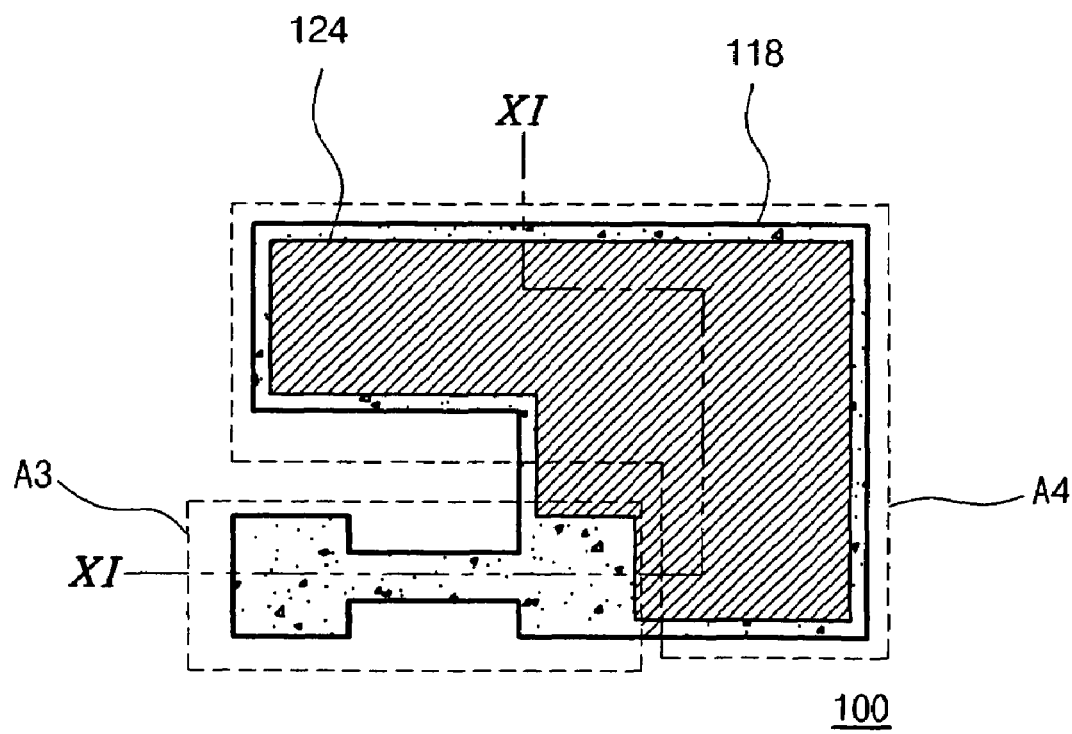
Figure 10F:
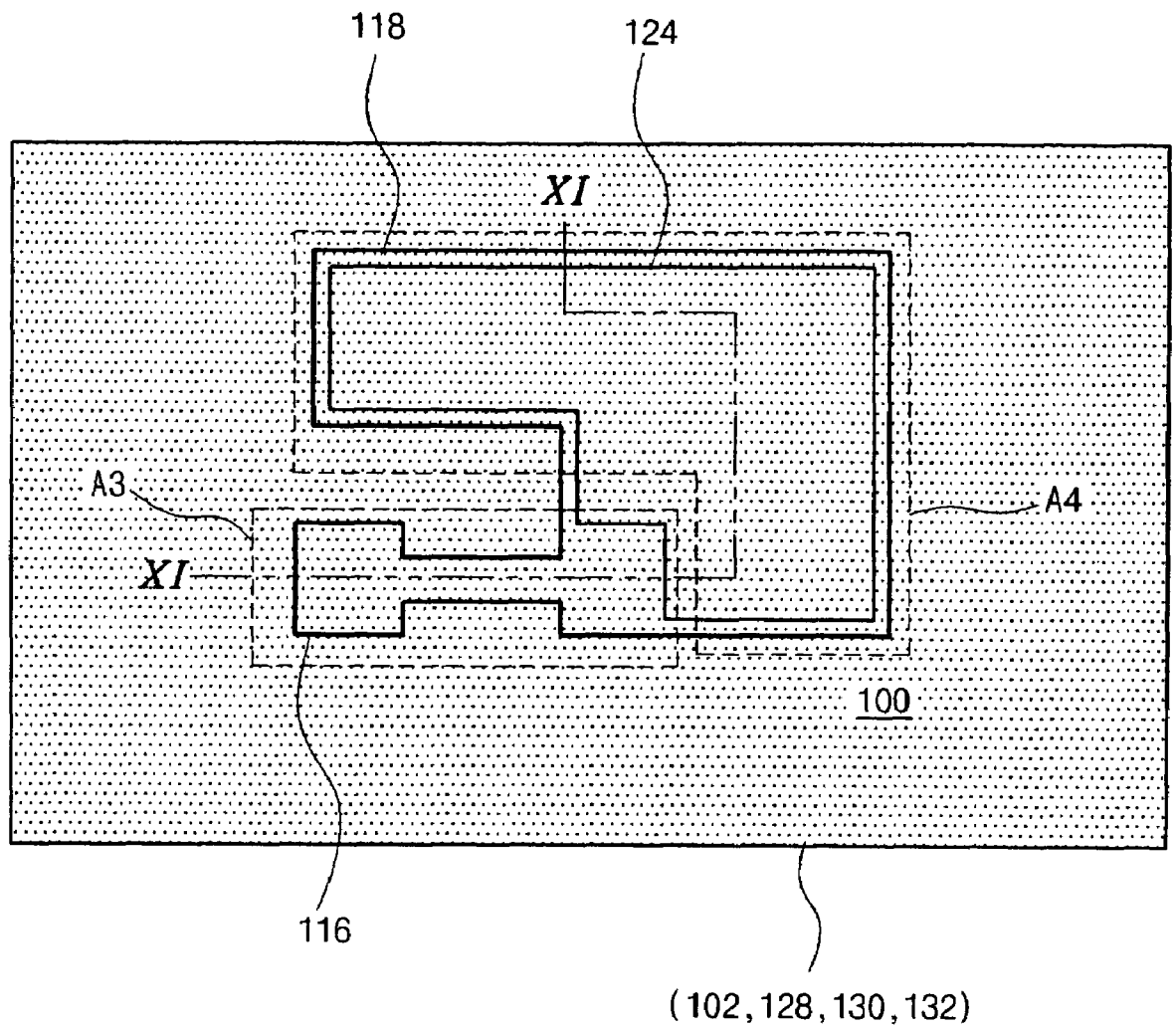
Figure 10G:
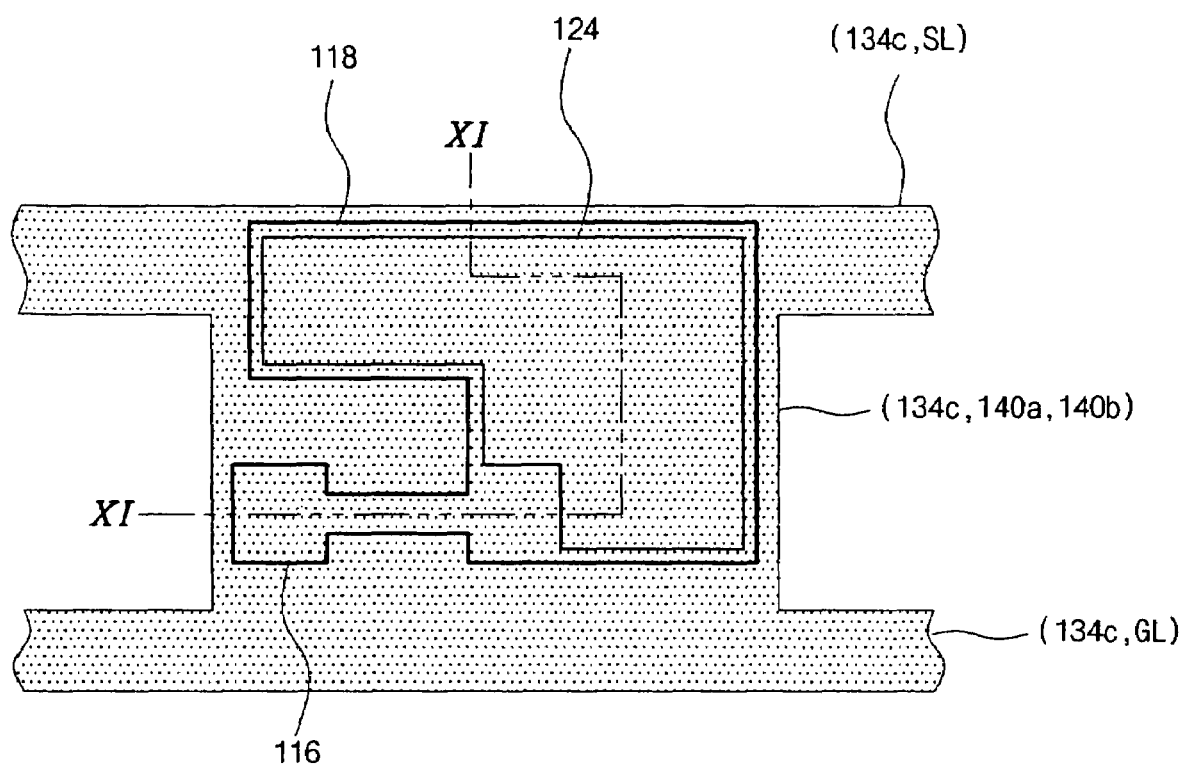
Figure 10H:
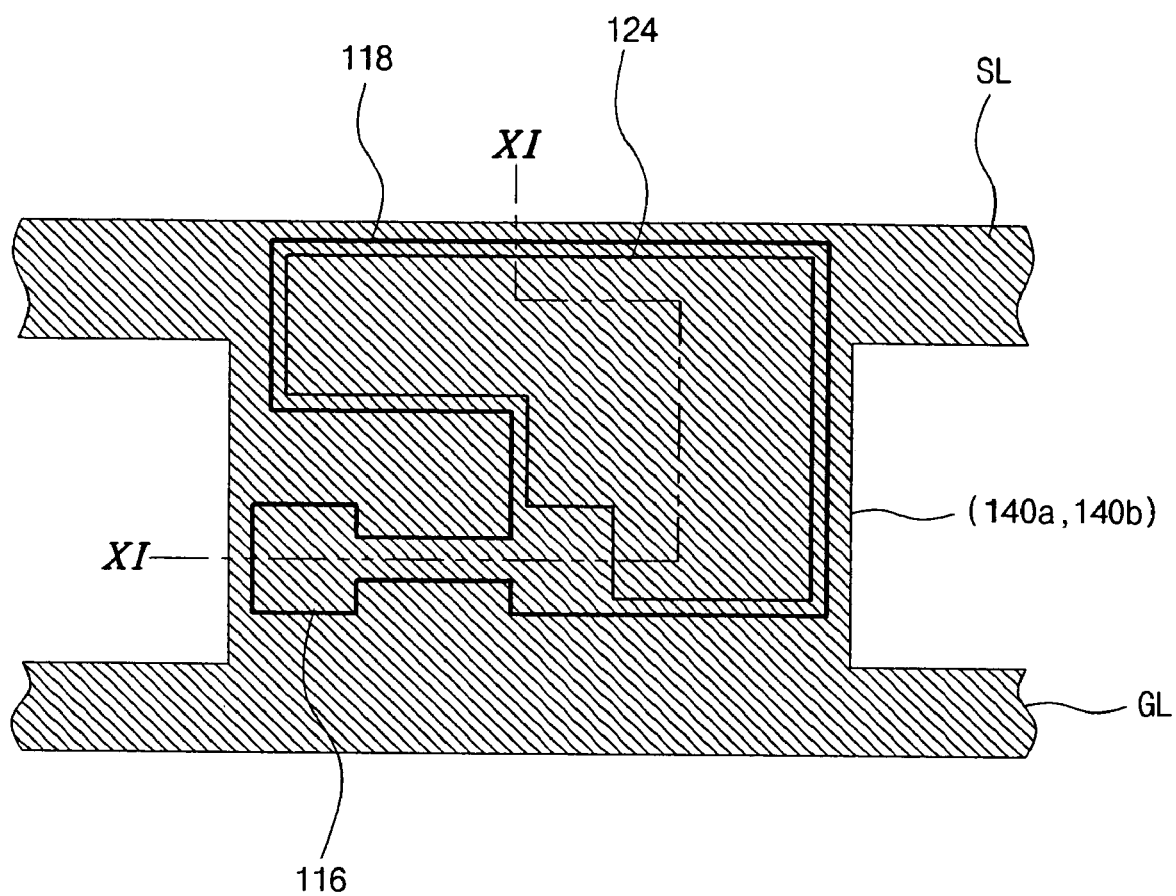
Figure 10I:
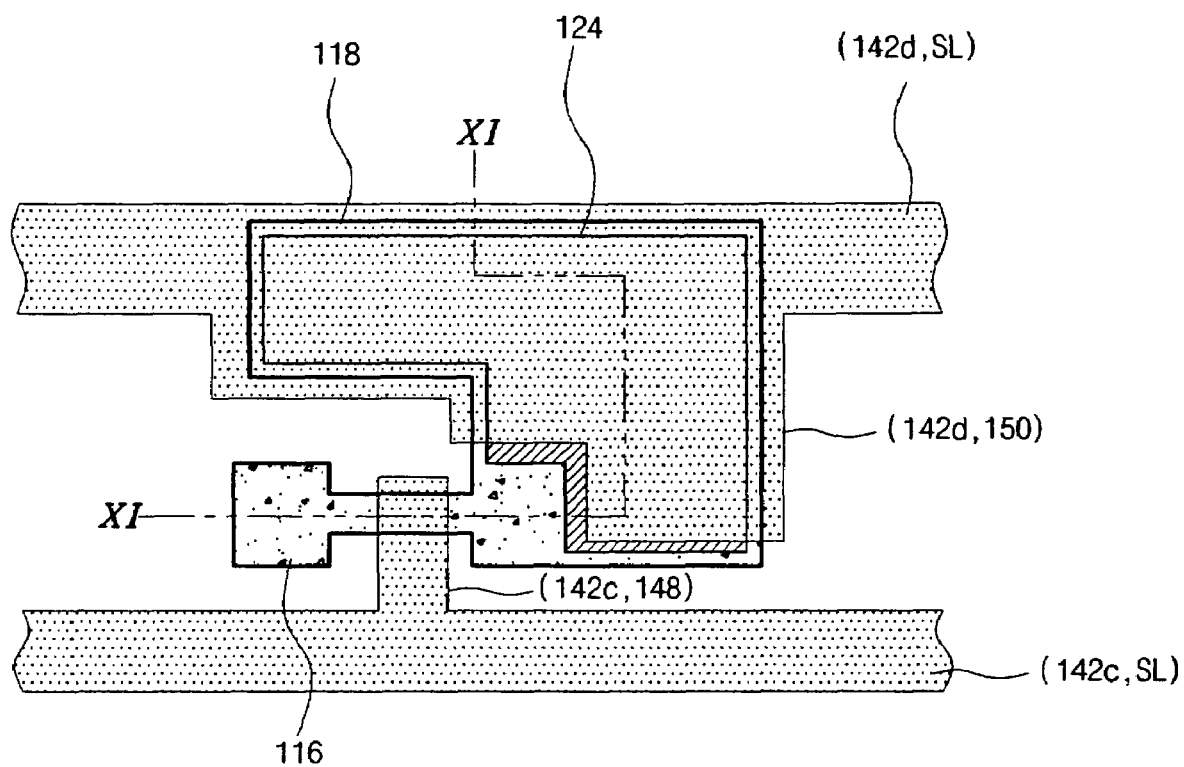
Figure 10J:
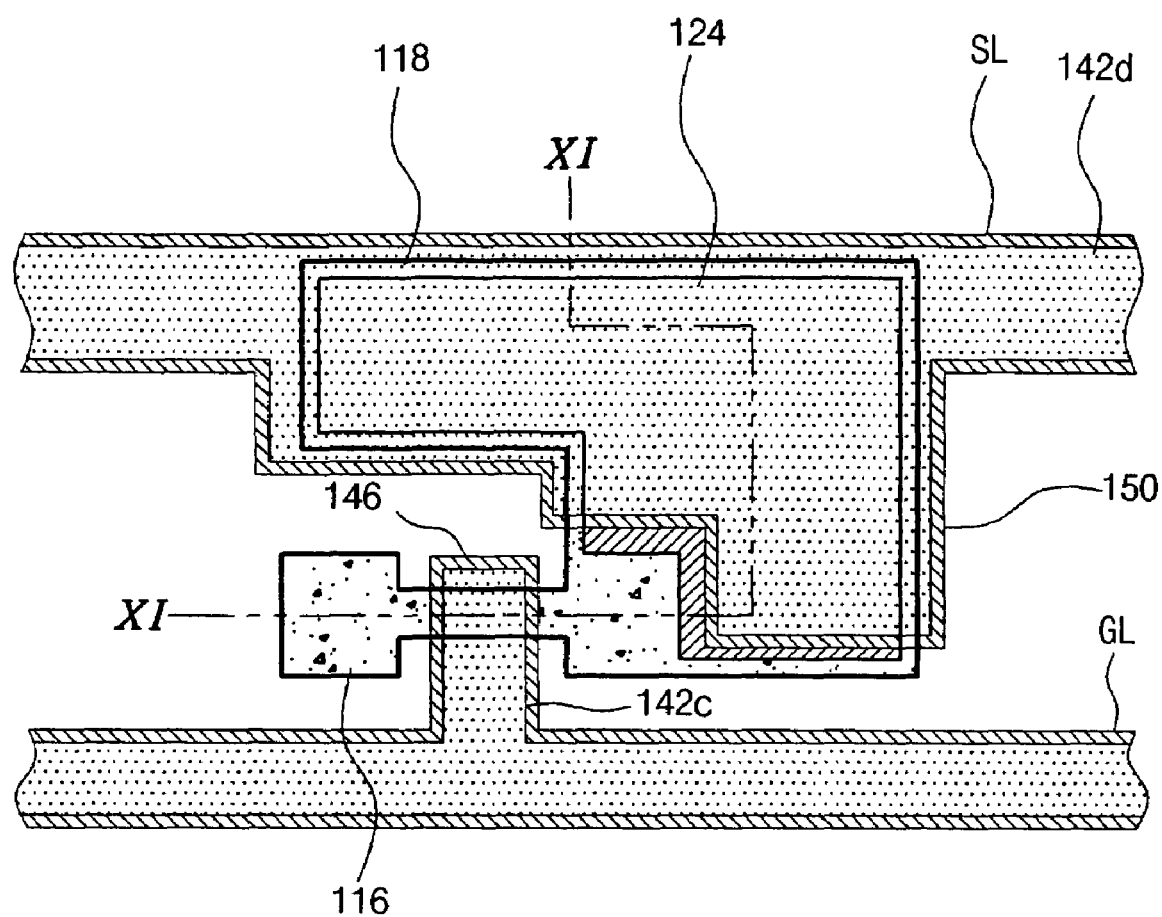
Figure 10K:
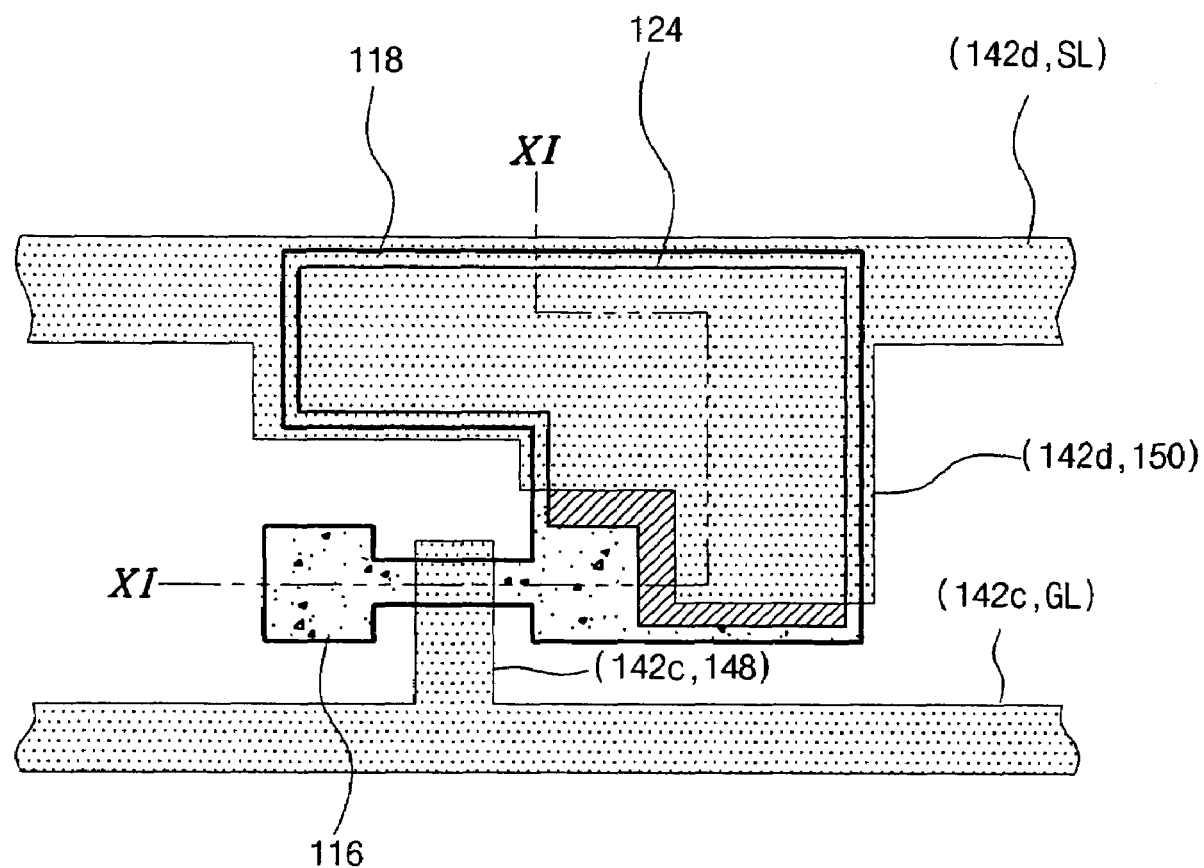
Figure 10L:
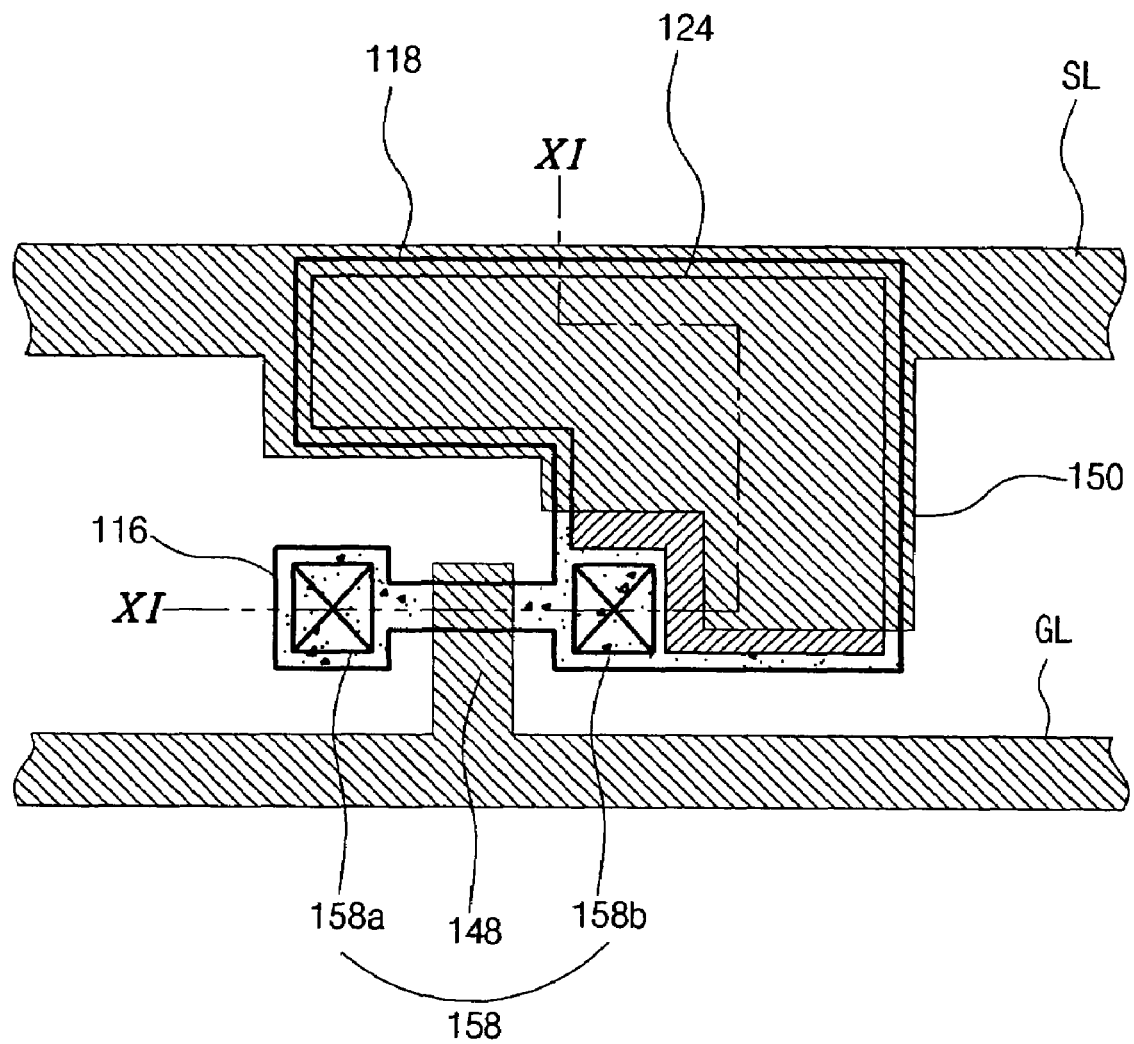
Figure 10M:
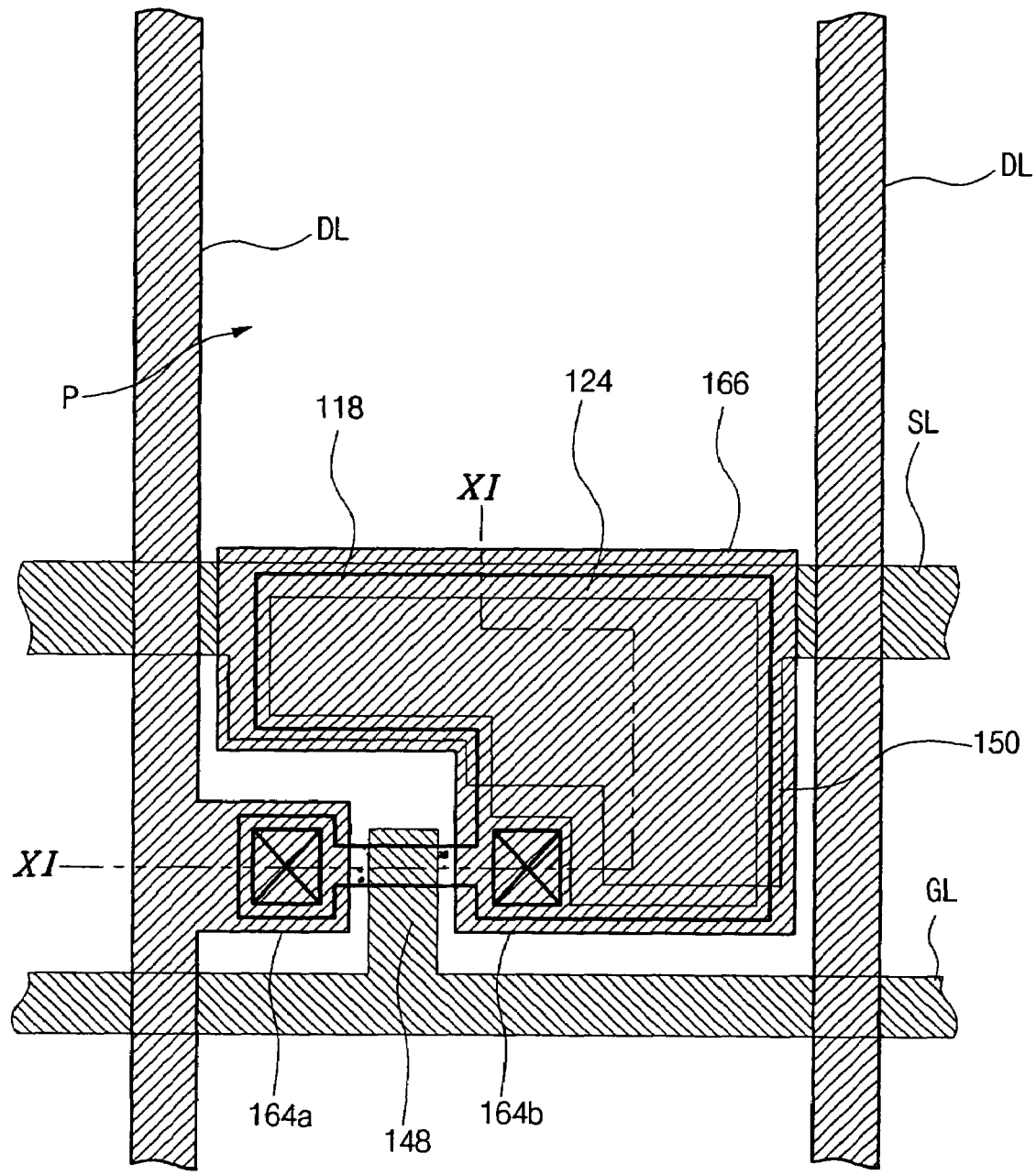
Figure 10N:
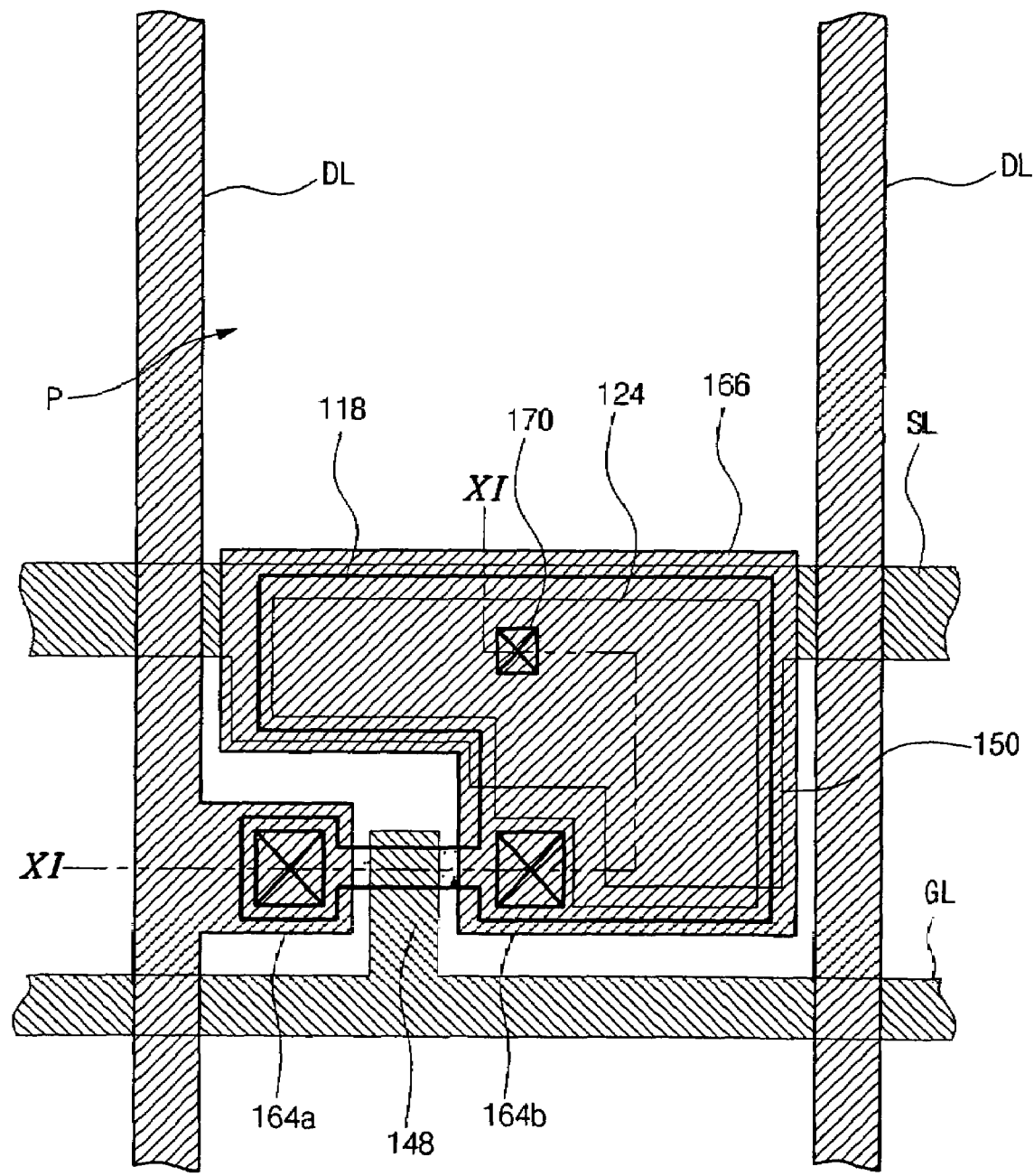
Figure 10O:
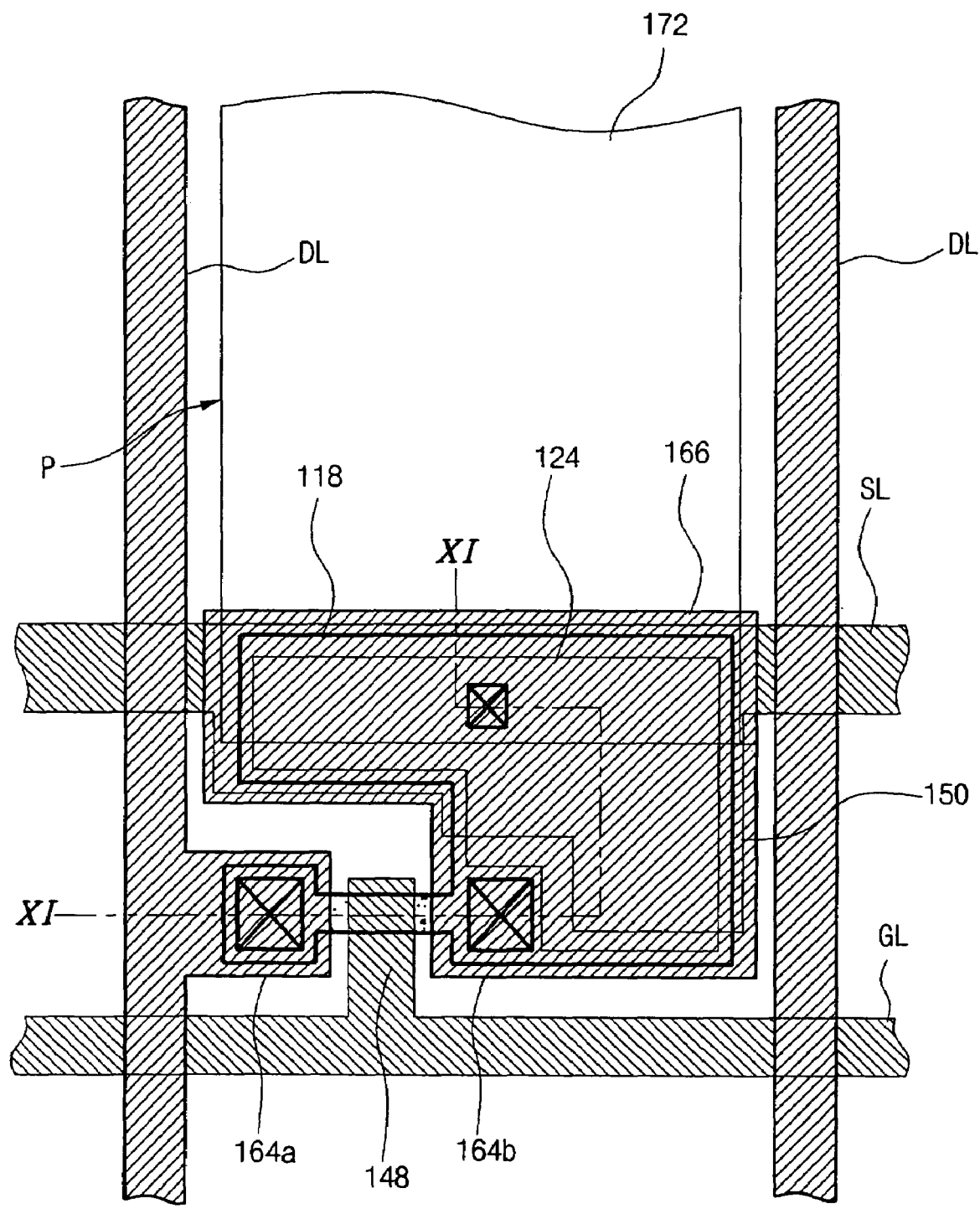

FIGS. 10A to 10O are schematic plan views showing a process of fabricating an array substrate in a display area for an LCD device according to an embodiment of the present invention.

Figure 11A:
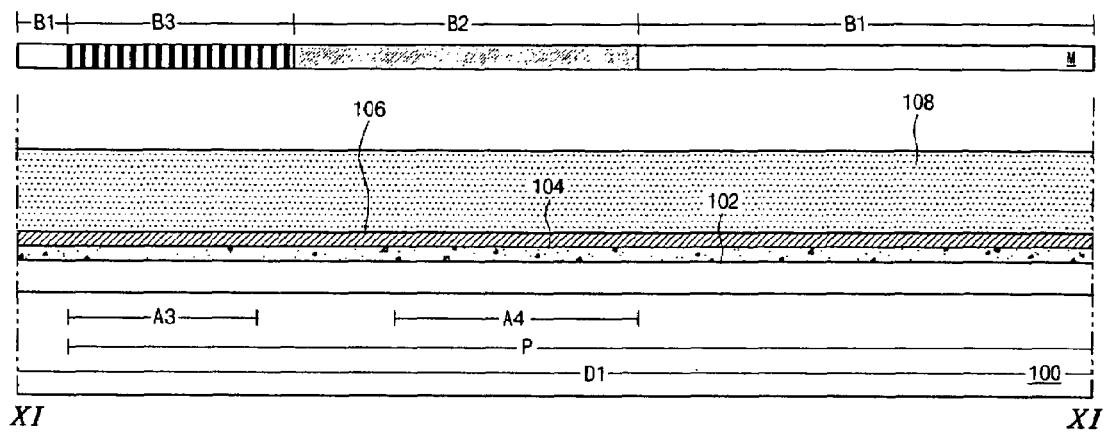
FIGS. 11A, 11B, 11C, 11D, 11E, 11F, 11G, 11H, 11I, 11J, 11K, 11L, 11M, 11N and 11O are schematic cross-sectional views taken along a line "XI-XI" of FIGS. 10A, 10B, 10C, 10D, 10E, 10F, 10G, 10H, 10I, 10J, 10K, 10L, 10M, 10N and 10O, respectively.
Figure 11B:
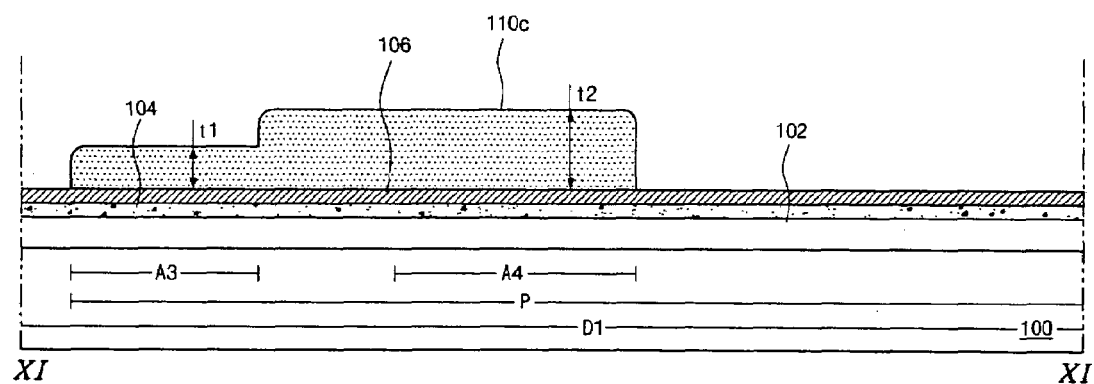
Figure 11C:
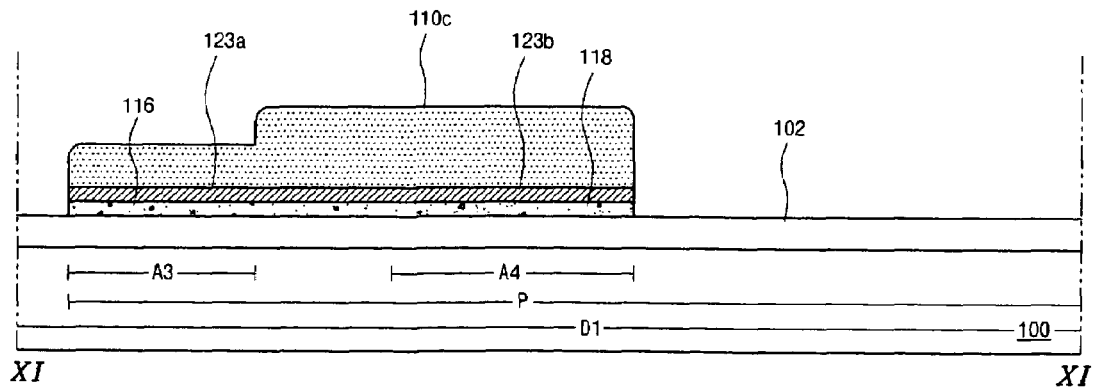
Figure 11D:
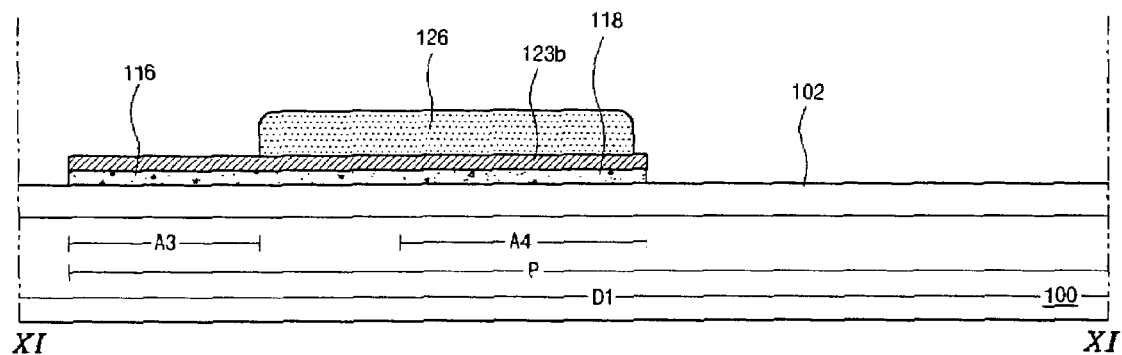
Figure 11E:
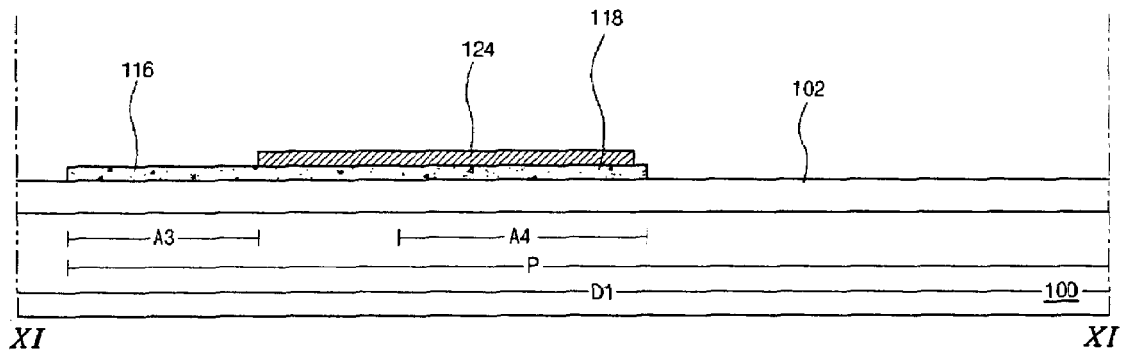
Figure 11F:
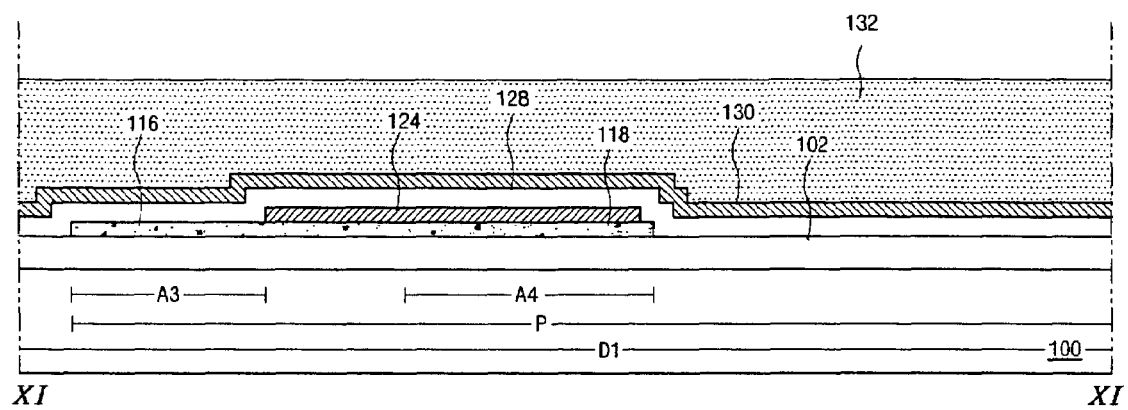
Figure 11G:
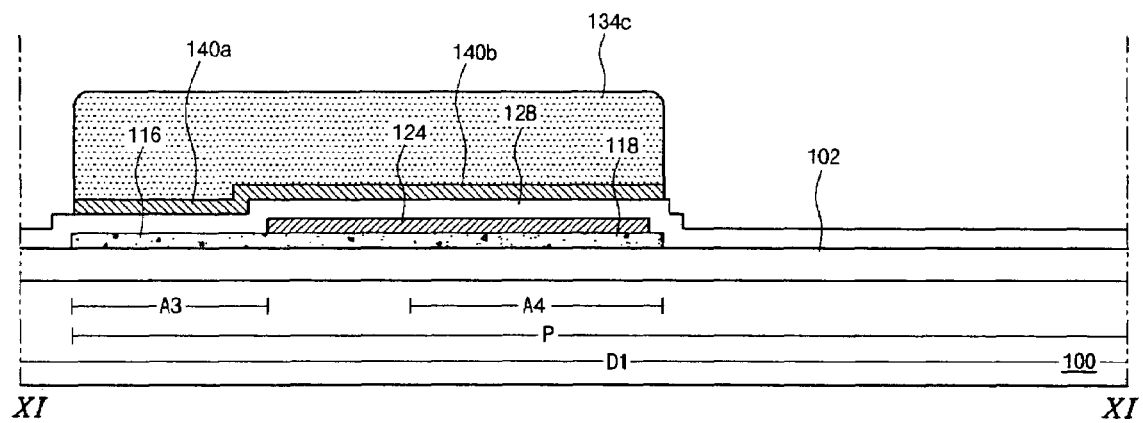
Figure 11H:
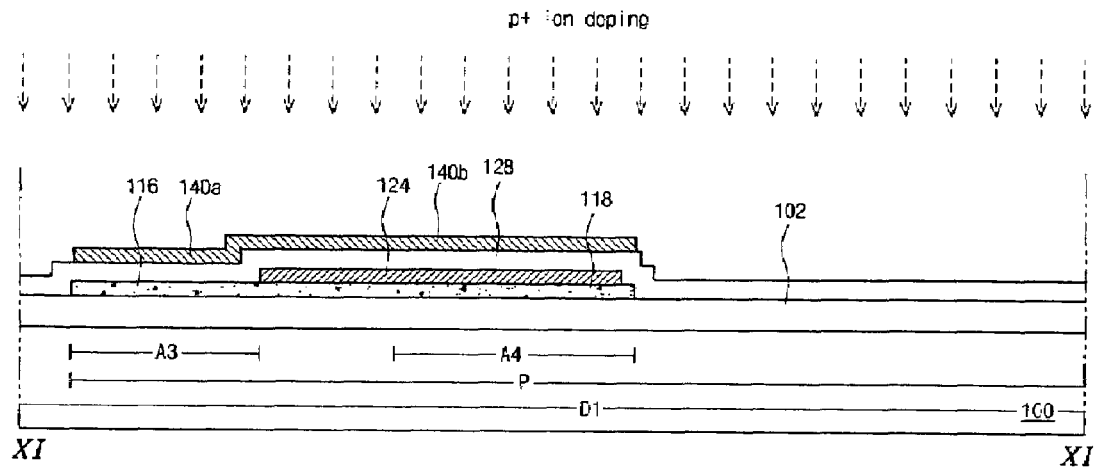
Figure 11I:
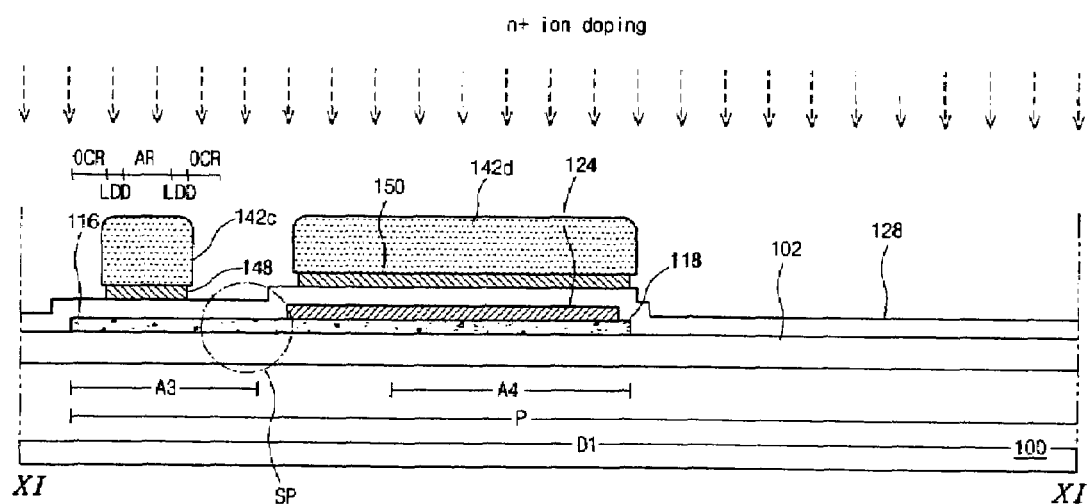
Figure 11J:
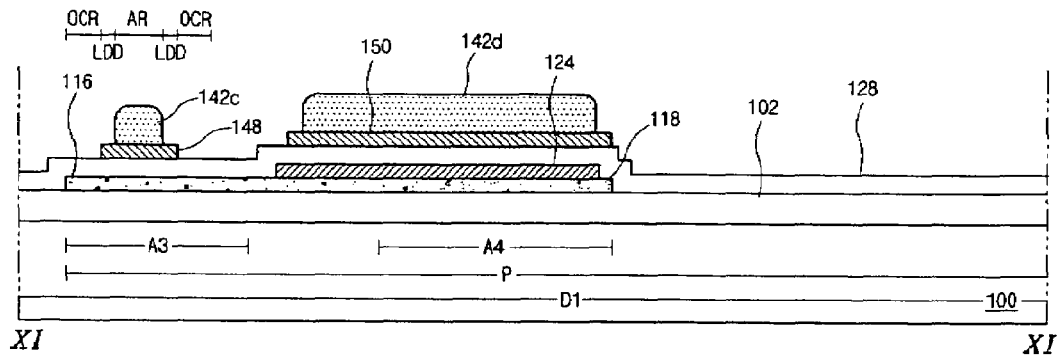
Figure 11K:
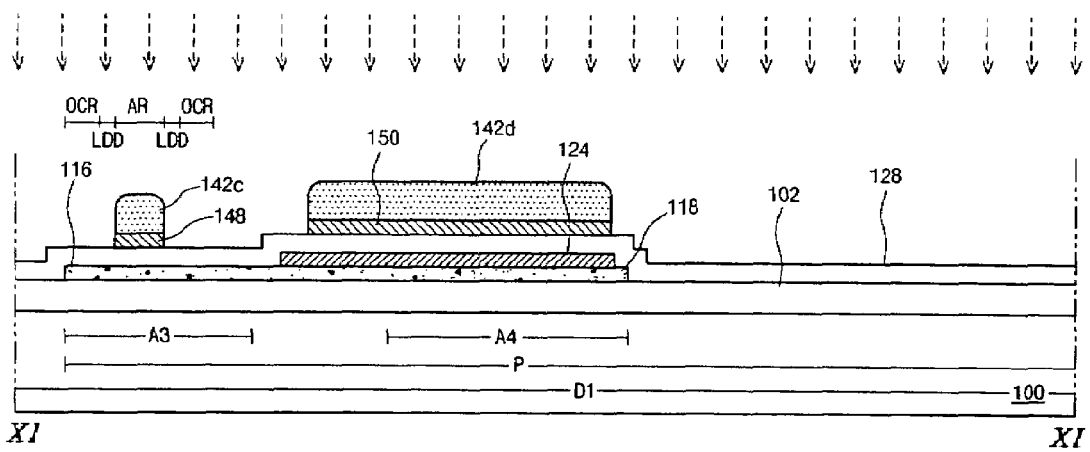
Figure 11L:
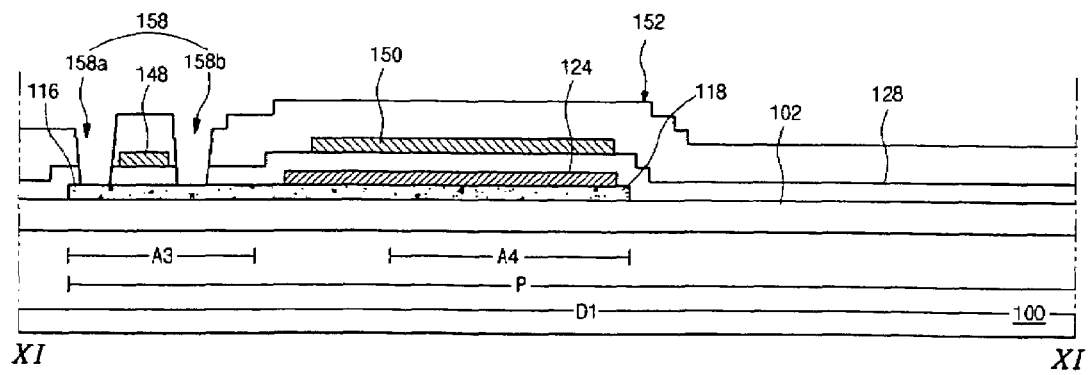
Figure 11M:
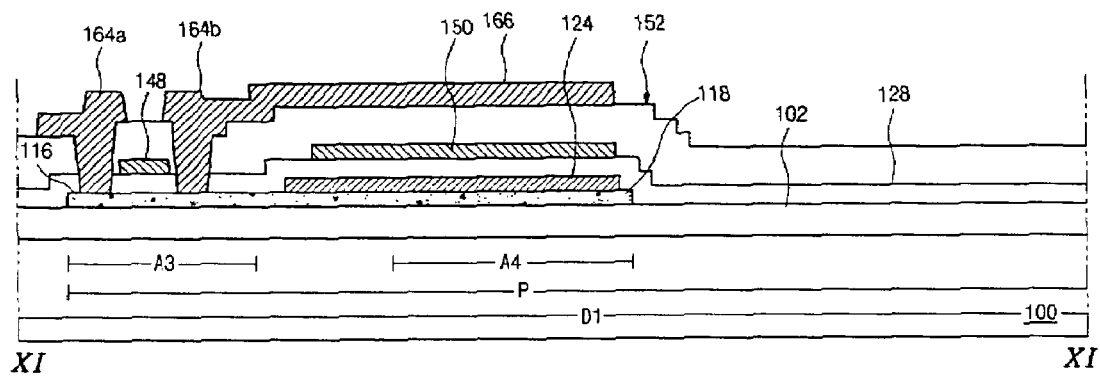
Figure 11N:
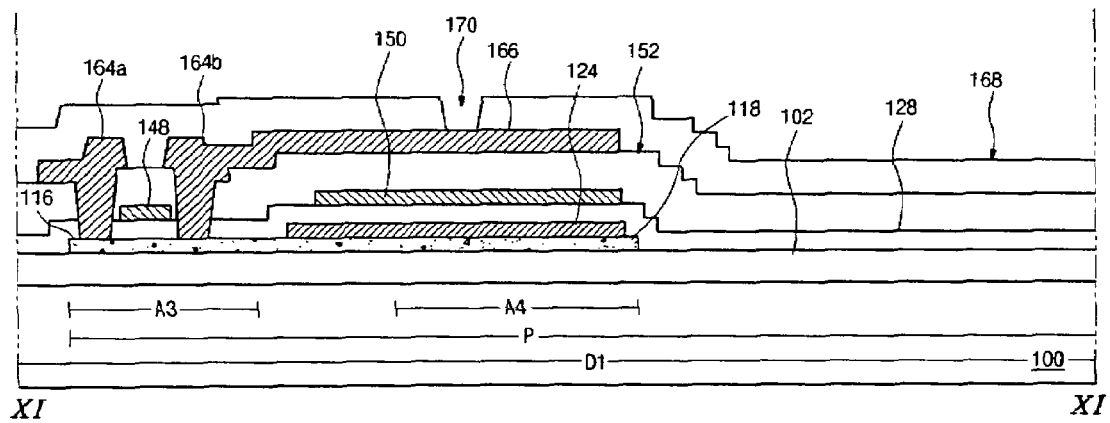
Figure 11O:
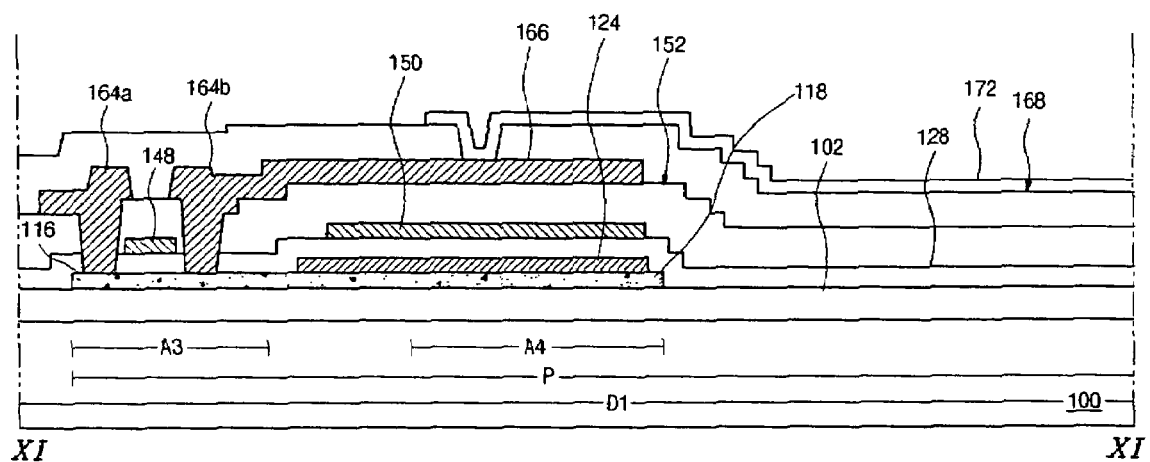

FIGS. 11A to 11O are schematic cross-sectional views taken along a line "XI-XI" of FIG. 10A to 10O, respectively.

In FIGS. 9A, 10A and 11A, a substrate 100 includes a display area "D1" and a non-display area "D2." The non-display area "D2" may be classified into a first region "A1" and a second region "A2," and the display area "D1" may be classified into a third region "A3" and a fourth region "A4." The third region "A3" and the fourth region "A4" may constitute a pixel region "P."

A buffer layer 102, a polysilicon material layer 104 and a first metallic material layer 106 are sequentially formed on the substrate 100.

Next, a photoresist (PR) material layer 108 is formed on the first metallic material layer 106 and a mask "M" is disposed over the PR material layer 108. The mask "M" includes a transmissive region "B1," a blocking region "B2," and a half-transmissive region "B3."

The PR material layer 108 may be a positive type PR material or a negative type PR material. When the PR material layer 108 is a positive type PR material, the blocking region "B2" corresponds to the fourth region "A4" and the half-transmissive region "B3" corresponds to the first to third regions "A1 to A3."

The buffer layer 102 may include an inorganic insulating material, such as silicon nitride (SiNx) or/and silicon oxide (SiOx). The polysilicon material layer 104 may be formed by depositing, dehydrogenating and crystallizing an intrinsic amorphous silicon (a-Si:H) material. The first metallic material layer 104 may include chromium (Cr), molybdenum (Mo), tungsten (W), or molybdenum-tungsten (MoW).

In FIGS. 9B, 10B and 11B, first, second and third PR patterns 110a, 110b and 110c are formed by exposing and developing the PR material layer 108 through a first mask process. The first and second PR patterns 110a and 110b are disposed in the first and the second regions "A1 and A2," and the third PR pattern 110c is disposed in the third and the fourth regions "A3 and A4." Further, the PR patterns 110a, 110b and 110c in the first to third regions "A1, A2 and A3" have a first thickness "t1," and the third PR pattern "110c" in the fourth region "A4" has a second thickness "t2." Here, the first thickness "t1" is thinner than the second thickness "t2." This is because the PR patterns 110a, 110b and 110c in the first to third regions "A1, A2 and A3" are exposed using the half-transmissive region "B3" of the mask "M." The half-transmissive region "B3" partially transmits light. On the other hand, the third PR pattern "110c" in the fourth region "A4" has a thicker thickness "t2" because it is shielded from light using the blocking region "B2" of the mask "M."

In FIGS. 9C, 10C and 11C, portions of the first metallic layer 106 and the polysilicon material layer 104 exposed from the first to third PR patterns 110a, 110b and 110c are etched.

Through this process, the first metallic layer 106 and the polysilicon material layer 104 are patterned into first, second, third and fourth metal patterns 120, 122, 123a and 123b and first, second, third and fourth semiconductor layers 112, 114, 116 and 118, respectively. Here, the third and the fourth metal patterns 123a and 123b, and the third and the fourth semiconductor layers 116 and 118 are formed as one body, respectively.

Although not shown, the PR patterns 110a, 110b and 110c in the first to third regions "A1, A2 and A3" having the first thickness "t1" are removed by ashing from the substrate 100. However, the third PR pattern "110c" in the fourth region "A4" remains and has a thickness substantially equal to the difference between the second thickness "t2" and the first thickness "t1."

In FIGS. 9D, 10D and 11D, a fourth PR pattern 126 is formed by ashing the first to third PR patterns 110a, 110b and 110c. The fourth PR pattern has a thickness substantially equal to the difference between the second thickness "t2" and the first thickness "t1." That is, the fourth PR pattern 126 corresponds to the reduced third PR pattern 110c in the fourth region "A4."

Next, portions of the first, second and third metal patterns 120, 122 and 123a exposed by the fourth PR pattern 126 are etched.

Although not shown, the fourth PR pattern 126 is removed from the substrate 10 after the etching step.

In FIGS. 9E, 10E and 11E, the fourth metal pattern 123b is formed with an island shape to form a first storage electrode 124.

The first storage electrode 124 contacts the fourth semiconductor layer 118.

In FIGS. 9F, 10F and 11F, a gate insulating layer 128 and a second metallic material layer 130 are sequentially formed over the substrate 100.

Next, a PR material layer 132 is formed on the second metallic material layer 130.

In FIGS. 9G, 10G and 11G, fifth and sixth PR patterns 134a and 134b are formed in the first and the second regions "A1 and A2," respectively, and a seventh PR patterns 134c is formed in the third and the fourth regions "A3 and A4" through a second mask process.

Here, the fifth PR pattern 134a corresponds to a central portion of the first semiconductor layer 112, but the sixth and the seventh PR patterns 134b and 134c correspond to whole of the second to fourth semiconductor layers 114, 116 and 118, respectively. The first semiconductor layer 112 includes an active region "AR" at a central portion and ohmic contact regions "OCR" at both sides. The fifth PR pattern 134a is disposed over the active region "AR."

Next, portions of the second metallic material layer 130 exposed by the fifth to the seventh PR patterns 134a, 134b and 134c are etched to form a first gate electrode 136 in the first region "A1" and fifth, sixth and seventh metal patterns 138, 140a and 140b in the second to fourth regions "A2 to A4." The sixth and the seventh metal patterns 140a and 140b may be formed as one body.

The first gate electrode 136 is disposed to correspond to the active region "AR" of the first semiconductor layer 112.

Through this process, a gate line "GL" and a storage line "SL" are extended from the sixth and the seventh metal patterns 140a and 140b. The gate line "GL" and the storage line "SL" face each other with the sixth and the seventh metal patterns 140a and 140b as a center.

Although not shown, the fifth to seventh PR patterns 134a, 134b and 134c are removed from the substrate 100.

In FIGS. 9H, 10H and 11H, the ohmic contact regions "OCR" of the first semiconductor layer 112 exposed by the first gate electrode 136 are doped with high concentration p-type (p+) impurities.

In FIGS. 9I, 10I and 11I, eighth, ninth, tenth and eleventh PR patterns 142a, 142b, 142c and 142d are formed over the substrate 100 through a third mask process.

Each of the second and the third semiconductor layers 114 and 116 includes an active region "AR," ohmic contact regions "OCR" and lightly doped drain (LDD) regions "LDD" between the active region "AR" and the ohmic contact regions "OCR."

The eighth PR pattern 142a cover the first gate electrode 136 to correspond to the first semiconductor layer 112, the ninth PR pattern 142b is disposed in the active region "AR" and the LDD regions "LDD" of the second semiconductor layer 114, the tenth PR pattern 142c is disposed in the active region "AR" and the LDD regions "LDD" of the third semiconductor layer 116, and the eleventh PR pattern 142d is disposed to correspond to the first storage electrode 118.

Next, portions of the fifth to seventh metal patterns 138, 140a and 140b exposed from the ninth to the eleventh PR patterns 142b, 142c and 142d are etched. The fifth to the seventh metal patterns 138, 140a and 140b are patterned into a second gate electrode 146, a third gate electrode 148 and a second storage electrode 150, respectively.

In addition, portions of the second and the third semiconductor layers 114 and 116 and a space "SP" between the third and the fourth semiconductor layers 116 and 118 exposed from the eighth to the eleventh PR patterns 142a, 142b, 142c and 142d are doped with high concentration n-type (n+) impurities.

In FIGS. 9J, 10J and 11J, the eighth to the eleventh PR patterns 142a, 142b, 142c and 142d are ashed to reduce the width thereof.

In this process, the ninth and the tenth PR patterns 142b and 142c are reduced to expose both end portions of the second gate electrode and the third gate electrode 146 and 148 corresponding to the LDD regions "LDD" of the second and the third semiconductor layers 114 and 116, respectively. Simultaneously, both end portions of the gate line "GL" and the storage line "SL" are exposed from the reduced tenth PR patterns 142c.

Further, the eleventh PR pattern 142d is reduced to expose both end portions of the second storage electrode 150.

Next, portions of the second and the third gate electrodes 146 and 148 exposed from the reduced ninth and the tenth PR patterns 142b and 142c are etched to reduce the width thereof. Simultaneously, portions of the gate line "GL" and the storage line "SL" exposed from the tenth PR patterns 142c are etched, and portions of the second storage electrode 150 exposed from the eleventh PR pattern 142d are etched.

In FIGS. 9K, 10K and 11K, the LDD regions "LDD" and the ohmic contact regions "OCR" of the second and the third semiconductor layers 114 and 116 exposed by the second and the third gate electrodes 146 and 148 are doped with low concentration n-type (n−) impurities.

The ohmic contact regions "OCR" have been previously doped with n(+) impurities and thus have a higher concentration than that of n(−) impurities. According, the LDD regions "LDD" is substantially doped with n(−) impurities. The LDD regions "LDD" are formed to minimize leakage current by creating a thermionic effect at adjacent portions of the active region "AR."

Although not shown, the reduced eight to the reduced eleventh PR patterns 142a, 142b, 142c and 142d are removed from the substrate 100 after the doping process.

In FIGS. 9L, 10L and 11L, an interlayer insulating layer 152 is formed over the substrate 100. For example, the interlayer insulating layer 152 includes an inorganic insulating material, such as silicon nitride (SiNx) or silicon oxide (SiOx).

Next, the interlayer insulating layer 152 and the gate insulating layer 128 are etched to form first, second and third contact holes 154, 156 and 158 exposing the ohmic contact regions "OCR" of the first to third semiconductor layers 112, 114 and 116, respectively. The first to third contact holes 154, 156 and 158 include first source and first drain contact holes 154a and 154b, second source and second drain contact holes 156a and 156b, and third source and third drain contact holes 158a and 158b, respectively.

Although not shown, a thermal process is then performed with respect to the substrate 100 having the first to the third contact holes 154, 156 and 158 so that the n(+) impurities are diffused toward a bottom of the first storage electrode 124. Accordingly, the first storage electrode 124 is in an ohmic contact with the fourth semiconductor layer 118. Thus, the first storage electrode 124 and the fourth semiconductor layer 118 are electrically connected to each other.

Alternatively, since the third semiconductor layer 116 and the fourth semiconductor layer 118 may be formed as one body and apply the same signals as each other, the third drain contact hole 158b may be formed in a portion corresponding to the doped fourth semiconductor layer 118 and the first storage electrode 124.

In FIGS. 9M, 10M and 11M, first source and first drain electrodes 160a and 160b, second source and second drain electrodes 162a and 162b and third source and third drain electrodes 164a and 164b are formed over the substrate 100 through a fifth mask process to be connected to the ohmic contact regions "OCR" of the first to the third semiconductor layers 112, 114 and 116 via the first source and the first drain contact holes 154a and 154b, the second source and the second drain contact holes 156 and 156b and the third source and the third drain contact holes 158a and 158b, respectively.

Simultaneously, a third storage electrode 166 extended from the third drain electrode 164b is formed over the second storage electrode 150.

A data line "DL" connected to the third source electrode 164a is formed to cross the gate line "GL" and to define a pixel region "P."

In FIGS. 9N, 10N and 11N, a passivation layer 168 is formed over the substrate 100 and is etched to form a storage contact hole 170 exposing a portion of the third storage electrode 166 through a sixth mask process. For example, the passivation layer 168 includes an inorganic insulating layer such as silicon nitride (SiNx) or silicon oxide (SiOx).

Alternatively, the passivation layer 168 may have a drain contact hole (not shown) exposing a portion of the drain contact hole (not shown) instead of the storage contact hole 170.

In FIGS. 9O, 10O and 11O, a pixel electrode 172 is formed over the substrate 100 through a seventh mask process. For example, the pixel electrode 172 includes a transparent conductive material such as indium tin oxide (ITO) or indium zinc oxide (IZO).

The pixel electrode 172 is disposed in the pixel region "P" and is connected to the third storage electrode 166 via the storage contact hole 170. Alternatively, when the passivation layer 168 has the drain contact hole, the pixel electrode 172 is connected to the third drain electrode 164b via the drain contact hole.

According to the array substrate for the LCD device and the method of fabricating the same of the present invention, the number of the mask processes is reduced. Therefore, the mask process is simpler, production costs are reduced, and manufacturing time is reduced. Further, because the manufacturing process is simpler, the rate of defects is reduced, thereby improving product yield.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
    a substrate defining a display area and a non-display area;
    an n-type driving TFT and a p-type driving TFT in the non-display area;
    a switching TFT in the display region;
    a storage capacitor in the display region, the storage capacitor including first to third storage layers sequentially layered with intervening insulating layers, wherein the first storage layer contacts a fourth semiconductor layer under the first storage layer; and a pixel electrode in the display region, the pixel electrode connected to the switching TFT;

Wherein, the p-type driving TFT includes a second semiconductor layer including an active region and an ohmic contact region in a periphery of the active region, a first gate electrode, and first source and first drain electrodes, and wherein the ohmic contact region of the p-type driving TFT is doped with high concentration p-type (p+) impurities.

2. The array substrate according to claim 1, wherein the n-type driving TFT includes a third semiconductor layer including an active region, an ohmic contact region in a periphery of the active region and a lightly doped drain (LDD) region between the active region and the ohmic contact region, a second gate electrode, and second source and second drain electrodes.

3. The array substrate according to claim 2, wherein the ohmic contact region of the n-type driving TFT is doped with high concentration n-type (n+) impurities and the LDD region of the n-type driving TFT is doped with low concentration n-type (n−) impurities.

4. The array substrate according to claim 3, wherein the first to third semiconductor layers include a polysilicon material.

* * * * *